(12) United States Patent
Dresselhaus et al.

(10) Patent No.: US 9,812,525 B2
(45) Date of Patent: Nov. 7, 2017

(54) UNIVERSAL METHODOLOGY TO SYNTHESIZE DIVERSE TWO-DIMENSIONAL HETEROSTRUCTURES

(71) Applicant: Massachusetts Institute of Technology, Cambridge, MA (US)

(72) Inventors: Mildred S. Dresselhaus, Arlington, MA (US); Jing Kong, Winchester, MA (US); Tomas A. Palacios, Belmont, MA (US); Xi Ling, Cambridge, MA (US); Yuxuan Lin, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/373,687

(22) Filed: Dec. 9, 2016

(65) Prior Publication Data

US 2017/0170260 A1    Jun. 15, 2017

Related U.S. Application Data

(60) Provisional application No. 62/265,966, filed on Dec. 10, 2015.

(51) Int. Cl.
  *H01L 29/06*   (2006.01)
  *H01L 29/24*   (2006.01)
  *H01L 21/02*   (2006.01)

(52) U.S. Cl.
  CPC ........ *H01L 29/068* (2013.01); *H01L 21/0242* (2013.01); *H01L 21/0259* (2013.01); *H01L 21/0262* (2013.01); *H01L 21/02568* (2013.01); *H01L 21/02645* (2013.01);

(Continued)

(58) Field of Classification Search
  CPC .............. H01L 29/068; H01L 21/0259; H01L 21/0242; H01L 21/02645; H01L 21/0262; H01L 29/24; H01L 29/0665; H01L 21/02568; H01L 21/02551; H01L 21/02112
  See application file for complete search history.

(56) References Cited

U.S. PATENT DOCUMENTS

2015/0064471 A1    3/2015    Dresselhaus et al.

OTHER PUBLICATIONS

Zhao et al.,"Large-scale chemical assembly of atomically thin transistors and circuits", Nature Nanotechnology, vol. 11, pp. 954-960, Nov. 2016.*

(Continued)

*Primary Examiner* — Roy Potter
*Assistant Examiner* — Paul Patton
(74) *Attorney, Agent, or Firm* — Modern Times Legal; Robert J. Sayre

(57) ABSTRACT

A two-dimensional heterostructure is synthesized by producing a patterned first two-dimensional material on a growth substrate. The first two-dimensional material is patterned to define at least one void through which an exposed region of the growth substrate is exposed. Seed molecules are selectively deposited either on the exposed region of the growth substrate or on the patterned first two-dimensional material. A second two-dimensional material that is distinct from the first two-dimensional material is then grown from the deposited seed molecules.

25 Claims, 18 Drawing Sheets

(52) U.S. Cl.
CPC .......... *H01L 29/0665* (2013.01); *H01L 29/24* (2013.01); *H01L 21/02112* (2013.01); *H01L 21/02551* (2013.01)

(56) References Cited

OTHER PUBLICATIONS

United States Patent and Trademark Office, International Search Report and Written Opinion for PCT/US2016/065887 (dated Feb. 23, 2017) (corresponding PCT application).
X. Ling, et al., "Role of the Seeding Promoter in MoS2 Growth by Chemical Vapor Deposition", 14 Nano Lett. 464-472 (2014).
Y.-H. Lee, et al., "Synthesis of large-area MoS2 atomic layers with chemical vapor deposition", 24 Adv. Mater. 2320-25 (2012).
Y.-H. Lee, et al., "Synthesis and transfer of single-layer transition metal disulfides on diverse surfaces", 13 Nano Lett. 1852-57 (2013).
X.-Q. Zhang, et al., "Synthesis of Lateral Heterostructures of Semiconducting Atomic Layers", 15 Nano Lett. 410-15 (Dec. 11, 2014).
X.-Q. Zhang, et al., "Synthesis of Lateral Heterostructures of Semiconducting Atomic Layers: Supplementary Information", <available at http://pubs.acs.org/doi/suppl/10.1021/nl503744f> (Dec. 11, 2014).
M. Zhao, et al., "Large-scale chemical assembly of atomically thin transistors and circuits," 11 Nature Nanotechnology 954-59 (Jul. 11, 2016).
M. Zhao, et al., "Large-scale chemical assembly of atomically thin transistors and circuits: Supplementary Information" <available at http://dx.doi.org/10.1038/nnano.2016.115> (Jul. 11, 2016).
M. Guimaraes, et al., "Atomically Thin Ohmic Edge Contacts Between Two-Dimensional Materials", 10 ACS Nano 6392-99 (Jun. 14, 2016).
M. Guimaraes, et al., "Atomically Thin Ohmic Edge Contacts Between Two-Dimensional Materials: Supplementary Information" <available at http://pubs.acs.org/doi/suppl/10.1021/acsnano.6b02879> (Jun. 14, 2016).

\* cited by examiner

UNIVERSAL METHODOLOGY TO SYNTHESIZE DIVERSE TWO-DIMENSIONAL HETEROSTRUCTURES

RELATED APPLICATION

This application claims the benefit of U.S. Provisional Application No. 62/265,966, filed 10 Dec. 2015, the entire content of which is incorporated herein by reference.

GOVERNMENT SUPPORT

This invention was made with Government support under Grant No. DMR1004147 awarded by the National Science Foundation and under Grant No. N000141210959 awarded by the Office of Naval Research and under Contract No. W911NF13D0001 awarded by the Army Research Office. The Government has certain rights in the invention.

BACKGROUND

Large-scale integration of atomically thin metals (e.g., graphene), semiconductors (e.g., transition metal dichalcogenides (TMDs)), and insulators (e.g., hexagonal boron nitride) is critical for constructing the building blocks for future nanoelectronics and nanophotonics, as described in Roy, K., et al., "Graphene-$MoS_2$ hybrid structures for multifunctional photoresponsive memory devices,"8 Nat. Nanotechnol. 826-830 (2013); Yu, W. J., et al., "Vertically stacked multi-heterostructures of layered materials for logic transistors and complementary inverters," 12 Nat. Mater. 246-252 (2012); Dean, C. R., et al., "Boron nitride substrates for high-quality graphene electronics," 5 Nat. Nanotechnol. 722-726 (2010); Liu, Z., et al., "In-plane heterostructures of graphene and hexagonal boron nitride with controlled domain sizes," 8 Nat. Nanotechnol. 119-124 (2013); Yu, W. J., et al., "Highly efficient gate-tunable photocurrent generation in vertical heterostructures of layered materials," 8 Nat. Nanotechnol. 952-958 (2013); and Britnell, L., et al., "Strong light-matter interactions in heterostructures of atomically thin films," 340 Science 1311-1314 (2013). However, the construction of in-plane heterostructures, especially between two atomic layers with large lattice mismatch, can be extremely difficult due to the strict requirement of spatial precision and the absence of a selective etching method.

As the fundamental limit of Moore's law is approaching, the global semiconductor industry is intensively looking for applications beyond complementary metal-oxide-semiconductor (CMOS) electronics. The atomically thin and ultra-flexible nature of two-dimensional (2D) materials [such as graphene, hexagonal boron nitride (hBN) and transition metal dichalcogenides (TMDs)] offer a competitive solution not only to push the forefront of semiconductor technology further, towards or perhaps beyond Moore's law, but also to potentially realize a vision of ubiquitous electronics and optoelectronics in the near future. Hybrid structures between 2D materials are essential building blocks with multi-functionality and broader capacity for nanoscale modern electronics and optoelectronics. The stacking of van der Waals heterostructures in the vertical direction can be accomplished by either mechanical transfer or hetero-epitaxy, whereas atomic stitching of 2D materials in the horizontal direction through conventional nanofabrication technology has proven to be far more challenging, mainly because of the lack of a selective etching method for each specific 2D material. Precise spatial control and self-limiting processes are highly desired to design and prepare lateral heterostructures. Researchers have attempted to build lateral heterostructures between materials with similar lattice structures and small lattice mismatch, such as graphene-hBN, and TMD-TMD lateral heterostructures. However, parallel connection between two atomically layers with significant crystallographic dissimilarity, such as graphene-TMD or hBN-TMD lateral heterostructures, has never been achieved. Furthermore, most of these methods are not suitable for large-scale production.

BRIEF SUMMARY

Methods for synthesizing two-dimensional heterostructures and devices including those heterostructures are described herein, where various embodiments of the apparatus and methods may include some or all of the elements, features and steps described below.

A two-dimensional heterostructure can be synthesized by producing a patterned first two-dimensional material on a growth substrate. The first two-dimensional material is patterned to define at least one void through which an exposed region of the growth substrate is exposed. Seed molecules are selectively deposited either on the exposed region of the growth substrate or on the patterned first two-dimensional material. A second two-dimensional material that is distinct from the first two-dimensional material is then grown from the deposited seed molecules.

A device with a two-dimensional heterostructure includes a growth substrate; a pattern of a first two-dimensional material on the growth substrate, wherein patterned two-dimensional material defines at least one void; and a second two-dimensional material on the growth substrate in the void defined by the patterned first two-dimensional material, wherein the first two-dimensional material and the second two-dimensional material have a thickness no greater than 10 atomic layers, and wherein the second two-dimensional material fills the void but does not overlap with the first two-dimensional material by more than 50 nm.

This general synthesis methodology can achieve both vertical and in-plane "parallel-stitched" heterostructures between two-dimensional (2D) and TMD materials, which enables both multifunctional electronic/optoelectronic devices and their large-scale integration. This is achieved via selective "sowing" of aromatic molecule seeds during the chemical-vapor-deposition growth. $MoS_2$ is used as a model system to form heterostructures with a diverse selection of other 2D materials. Direct and controllable synthesis of large-scale parallel-stitched graphene-$MoS_2$ heterostructures was further investigated. Unique nanometer overlapped junctions were obtained at the parallel-stitched interface, which are highly desirable both as metal-semiconductor contact and functional devices/systems, such as for use in logical integrated circuits (ICs) and broadband photodetectors.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
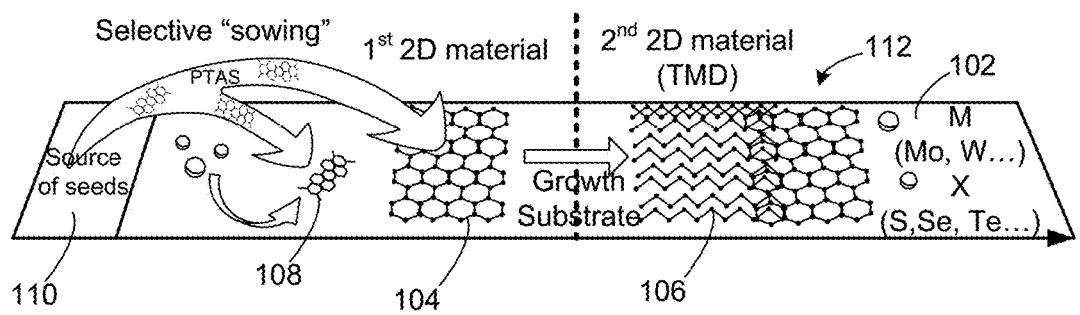
FIG. 1 is a schematic illustration of a CVD apparatus and process for the synthesis of a parallel-stitched 2D-TMD heterostructure 112.

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise herein defined, used or characterized, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially (though not perfectly) pure, as practical and imperfect realities may apply; e.g., the potential presence of at least trace impurities (e.g., at less than 1 or 2%) can be understood as being within the scope of the description. Likewise, if a particular shape is referenced, the shape is intended to include imperfect variations from ideal shapes, e.g., due to manufacturing tolerances. Percentages or concentrations expressed herein can be in terms of weight or volume.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to," "coupled to," "in contact with," etc., another element, it may be directly on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Described herein is a methodology to achieve both the vertically stacked and parallel-stitched heterostructures between two kinds of 2D materials regardless of the lattice mismatch between materials, with large-scale production capability. In these methods, during the chemical vapor deposition (CVD) of TMDs, as described in US Pat. App. Pub. No. 2015/0064471 A1 and in Zhang, X.-Q., et al., "Synthesis of lateral heterostructures of semiconducting atomic layers," 15 Nano Lett. 410-415 (2015), aromatic molecules, which are used as seeds to facilitate the growth, can be "sowed" either on the substrate or on another pre-deposited 2D material, in which the "sowing" process is selective depending on the wettability of seeds and surfaces. Consequently, vertically stacked or parallel-stitched heterostructures between TMDs and diverse 2D materials can be achieved regardless of lattice mismatch between materials. Vertical heterostructures are fabricated through sowing seeds on top of a 2D material, while lateral heterostructures are fabricated through sowing seeds on the blank region of a substrate. This technique offers an opportunity to synthesize most of the basic functional building blocks for electronic and optoeletronic devices in two dimensions, including metal-semiconductor (e.g., graphene-$MoS_2$), semiconductor-semiconductor (e.g., $WS_2$—$MoS_2$), and insulator-semiconductor (e.g., hBN—$MoS_2$) heterostructures, both horizontally and vertically.

A growth procedure of the parallel-stitched heterostructure 112 between a TMD and another 2D material through the selective "sowing" of perylene-3,4,9,10-tetracarboxylic acid tetrapotassium salt (PTAS) molecules on the growth substrate 102 is illustrated in FIG. 1. The details of this procedure are described in the Methods section and in the Supplementary Exemplification section, below. The first 2D material 104 is transferred onto a $SiO_2$/Si substrate (growth substrate 102) and can be patterned by lithography and etching. PTAS molecules were deposited onto a substrate (seed reservoir 110) placed next to the growth substrate 102. At the elevated growth temperature in the presence of a carrier gas, the PTAS molecules 108 from the source 110 reach the growth substrate 102. From our studies, it was observed that PTAS is more likely to be deposited onto a hydrophilic surface (e.g., $SiO_2$) rather than on the surfaces of 2D materials, which are mostly hydrophobic. PTAS molecules 108 are therefore "sowed" only in the exposed regions of the growth substrate 102 without the first 2D material 104 to promote the growth of the second 2D material 106 [here, a transition metal dichalcogenide (TMD)] within the $SiO_2$ region 102 with abundant seed molecules 108, whereas there is very limited TMD growth in the first 2D material region 104 due to the negligible amount of seed molecules 108 in this region. Consequently, the growth of the second 2D material 106 only occurs in the exposed $SiO_2$ regions 102, allowing the formation of parallel-stitched heterostructures 112 along the edges of the first 2D material 104.

Figure 2:
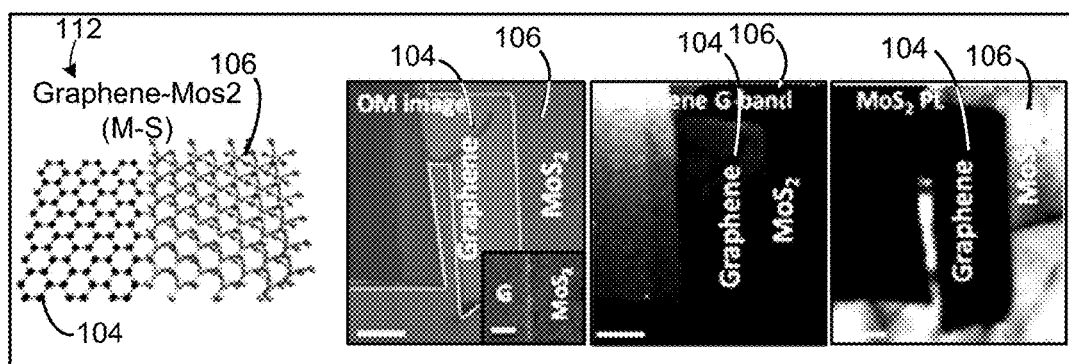
FIG. 2 includes a schematic illustration of a parallel-stitched heterostructure 112 of graphene(G) 104 and $MoS_2$ 106, at left, an optical-microscope image of such a structure next to it, and spectroscopic images of this structure in the two images at right. The boundaries between $MoS_2$ 106 and the pre-existing 2D graphene 104 are marked by the white dashed line. The scale bars are 5 μm. Insets in the optical images are the AFM images on the heterojunction (the scale bars are 500 nm).
Figure 3:
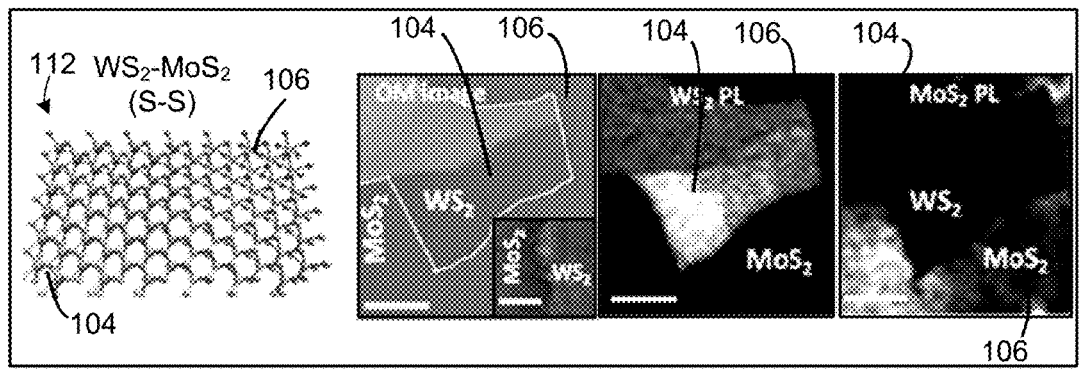
FIG. 3 includes a schematic illustration of a parallel-stitched heterostructure 112 of $WS_2$ 104 and $MoS_2$ 106, at left, an optical-microscope image of such a structure next to it, and spectroscopic images of this structure in the two images at right. The boundaries between $MoS_2$ 106 and the pre-existing 2D $WS_2$ 104 are marked by the white dashed line. The scale bars are 5 μm. Insets in the optical images are the AFM images on the heterojunction (the scale bars are 500 nm).
Figure 4:
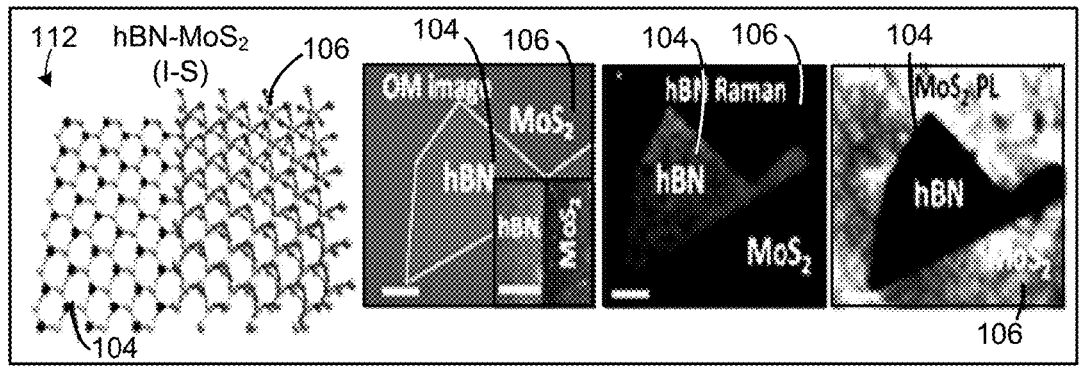
FIG. 4 includes a schematic illustration of a parallel-stitched heterostructure 112 of hexagonal boron nitride (bBN) 104 and $MoS_2$ 106, at left, an optical-microscope image of such a structure next to it, and spectroscopic images of this structure in the two images at right. The boundaries between $MoS_2$ 106 and the pre-existing 2D hBN 104 are marked by the white dashed line. The scale bars are 5 μm. Insets in the optical images are the AFM images on the heterojunction (the scale bars are 500 nm).
Figure 5:
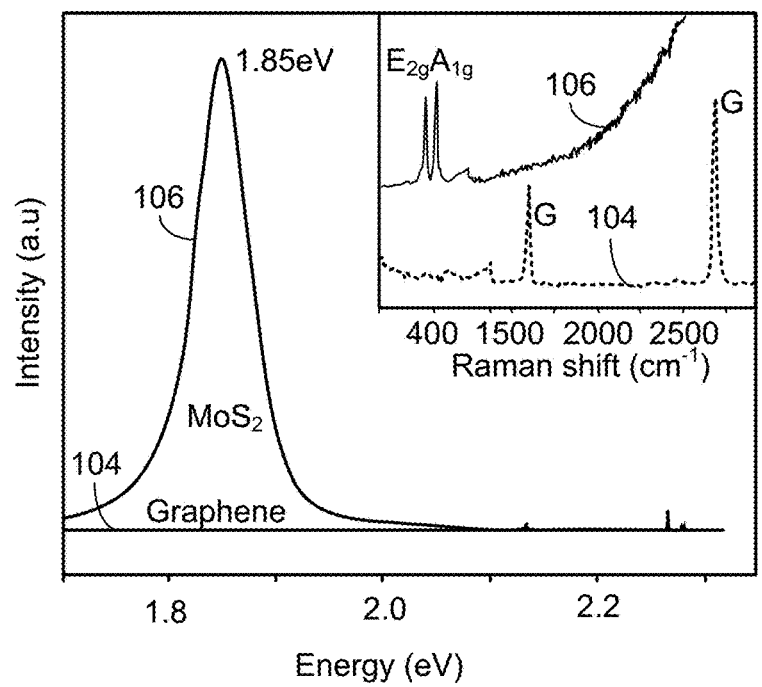
FIG. 5 plots typical photoluminescence (PL) spectra and Raman spectra (inset) collected on $MoS_2$ 106 and pre-existing 2D graphene 104 areas of a parallel-stitched heterostructure 112.
Figure 6:
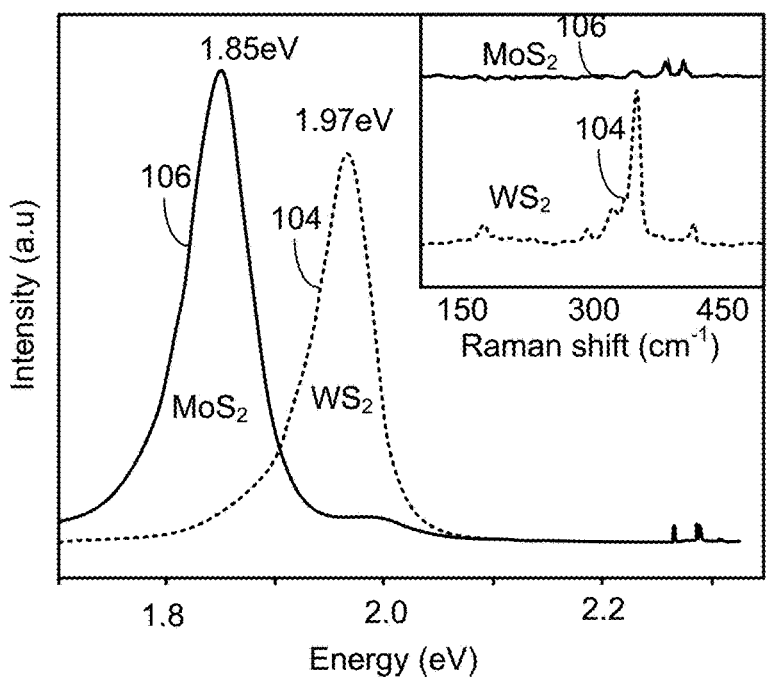
FIG. 6 plots typical PL spectra and Raman spectra (inset) collected on $MoS_2$ 106 and pre-existing 2D $WS_2$ 104 areas of a parallel-stitched heterostructure 112.
Figure 7:
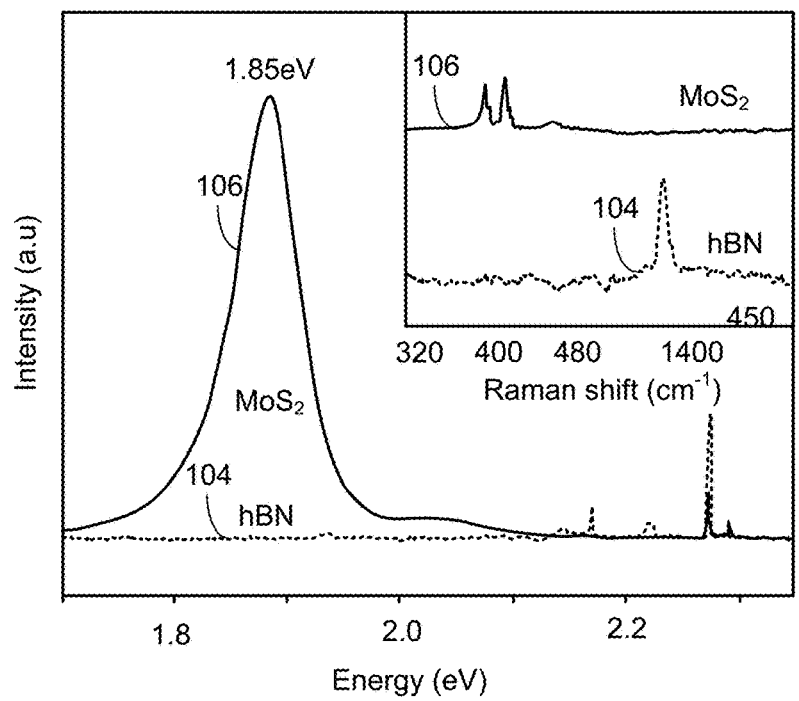
FIG. 7 plots typical PL spectra and Raman spectra (inset) collected on $MoS_2$ 106 and pre-existing 2D hBN 104 areas of a parallel-stitched heterostructure 112.
Figure 37:
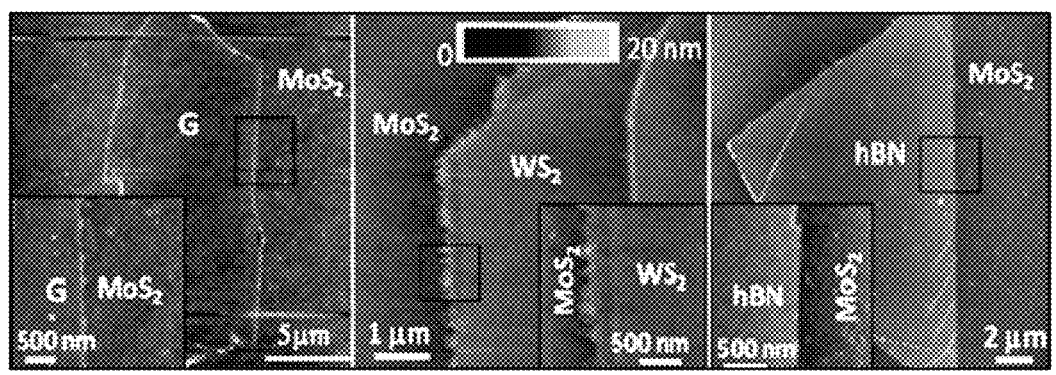
FIG. 37 shows typical atomic force microscope (AFM) images of the parallel-stitched graphene(G)-$MoS_2$ heterostructure (left), $WS_2$—$MoS_2$ heterostructure (center), and hBN-$MoS_2$ heterostructure (right). The inserts in each case show a zoom-in image at the heterojunction.
Figure 38:
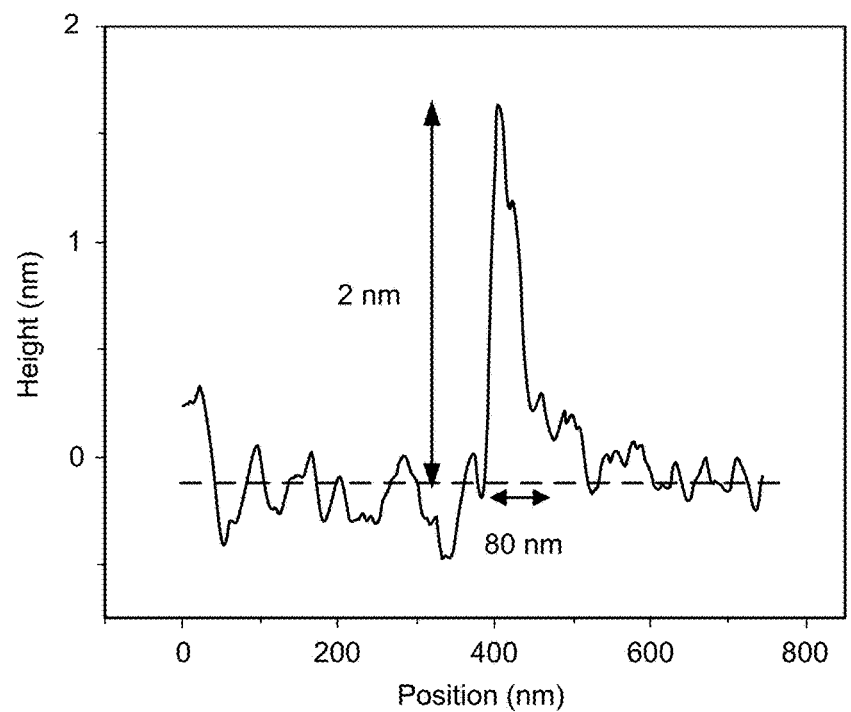
FIG. 38 plots the height cross-section analysis of the AFM image of the overlapping region of a parallel-stitched graphene-$MoS_2$ heterostructure of FIG. 37.
Figure 39:
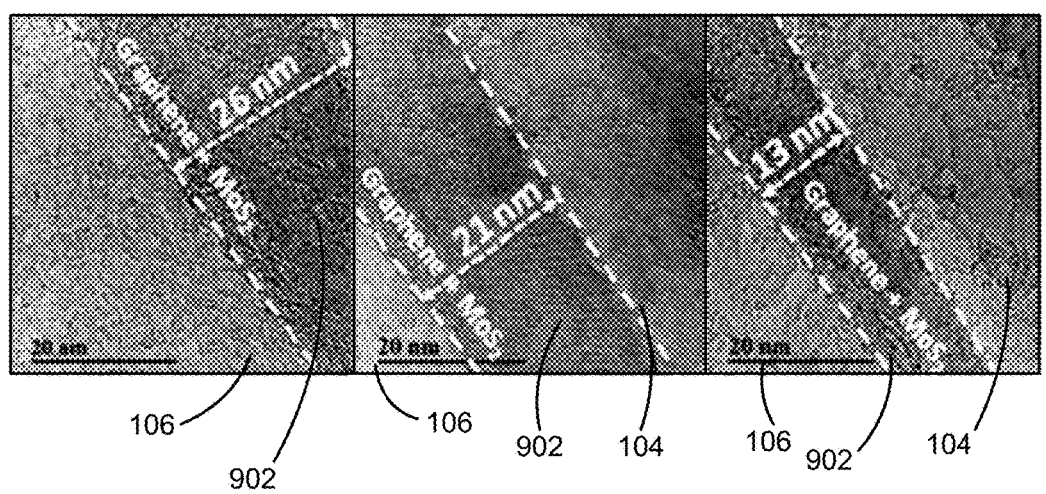
FIG. 39 includes high-magnification BF-TEM images of the graphene-$MoS_2$ heterostructures with the following different sizes for their overlapping regions 902: (a) 26 nm (left); (b) 21 nm (center), and (c) 13 nm (right).

FIGS. 2-7 show the growth results of parallel-stitched heterostructures 112 of graphene-$MoS_2$, $WS_2$—$MoS_2$ and hBN-$MoS_2$ as the prototypes of metal-semiconductor (M-S), semiconductor-semiconductor (S-S), and insulator-semiconductor (I-S) heterostructures 112, respectively. Optical microscopy (shown in FIGS. 2, 3, and 4), atomic force microscopy (AFM) (seen in the insets of the optical images of FIGS. 2, 3, 4, and in FIG. 37), and spectroscopy characterizations (shown in FIGS. 5-7) were carried out. These studies reveal that high-quality $MoS_2$ is grown on the exposed $SiO_2$ regions 102, not on top of the first 2D materials 104, but are well connected with them at the edges with minimal overlaps 902. The photoluminescence (PL) and Raman spectra are collected on and outside the first 2D materials 104, as shown in FIGS. 5-7. The intense PL signal around 1.85 eV, and the $E_{2g}$ and $A_{1g}$ Raman modes ($\Delta\omega=21$ $cm^{-1}$) obtained in the $MoS_2$ region (red traces in FIGS. 5-7) indicates the high quality of the monolayer $MoS_2$. While on top of the first 2D materials 104 (plotted in FIGS. 5-7), only the Raman modes from them (e.g., for monolayer graphene: G-band at 1582 $cm^{-1}$ and G'-band at 2676 $cm^{-1}$; $WS_2$: 174, 295, 322, 350 and 417 $cm^{-1}$; hBN: 1368 $cm^{-1}$) were observed. The intensity mappings of the Raman (or PL) signals from the first 2D materials 104 and the PL from $MoS_2$ 106 further indicate that high-quality monolayer $MoS_2$ 106 was only grown outside the first 2D materials 104 (as seen in FIGS. 2-4). We consequently conclude that sharp and well-stitched boundaries were formed at the edges of the first 2D materials 104 with no breaks or tears.

The formation of parallel-stitched heterostructures 112 between $MoS_2$ and various 2D materials shows that this approach provides a universal methodology to construct diverse parallel-stitched heterostructures 112 of 2D materials. With a similar strategy, vertically stacked heterostructures 112 between 2D materials can also be constructed. In this case, copper(II) 1,2,3,4,8,9,10,11,15,16,17,18,22,23,24, 25-hexadecafluoro-29H,31H-phthalocyanine ($F_{16}CuPc$) molecules were used as the seeds and deposited onto graphene or hBN. Under the growth condition, monolayer $MoS_2$ nucleates and grows around the seeds on graphene or hBN, forming the $MoS_2$/graphene (or hBN) vertically stacked two-dimensional heterostructure 112 (see the Supplementary Exemplification section, below, and Ling, X., et al., "Role of the seeding promoter in $MoS_2$ growth by chemical vapor deposition," Nano Lett. 14, 464-472 (2014). With the selective "sowing" methodology, we are, therefore, able to synthesize most of the basic functional building blocks for electronic and optoeletronic devices in two dimensions.

Figure 8:
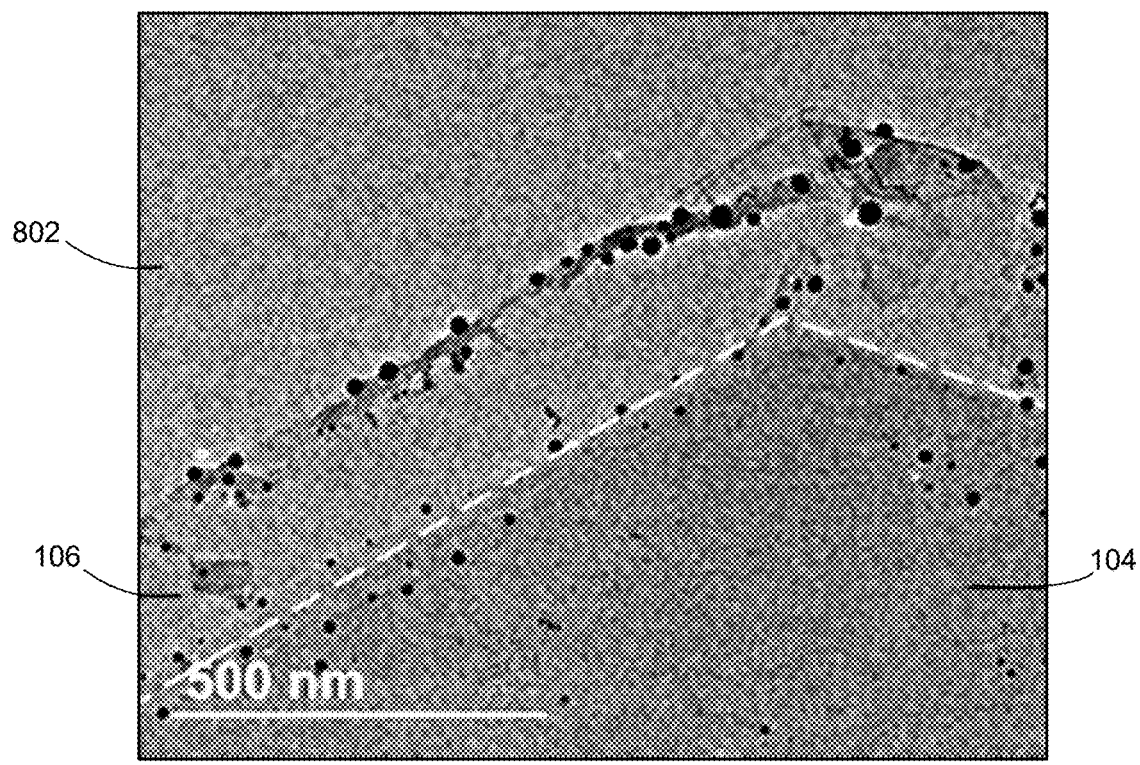
FIG. 8 is a low-magnification BF-TEM image showing a graphene-$MoS_2$ interface of a parallel-stitched graphene $MoS_2$ interface, showing a first 2D material (graphene) 104, a second 2D material ($MoS_2$) 106, and the vacuum 802 beyond the second 2D material 106.
Figure 9:
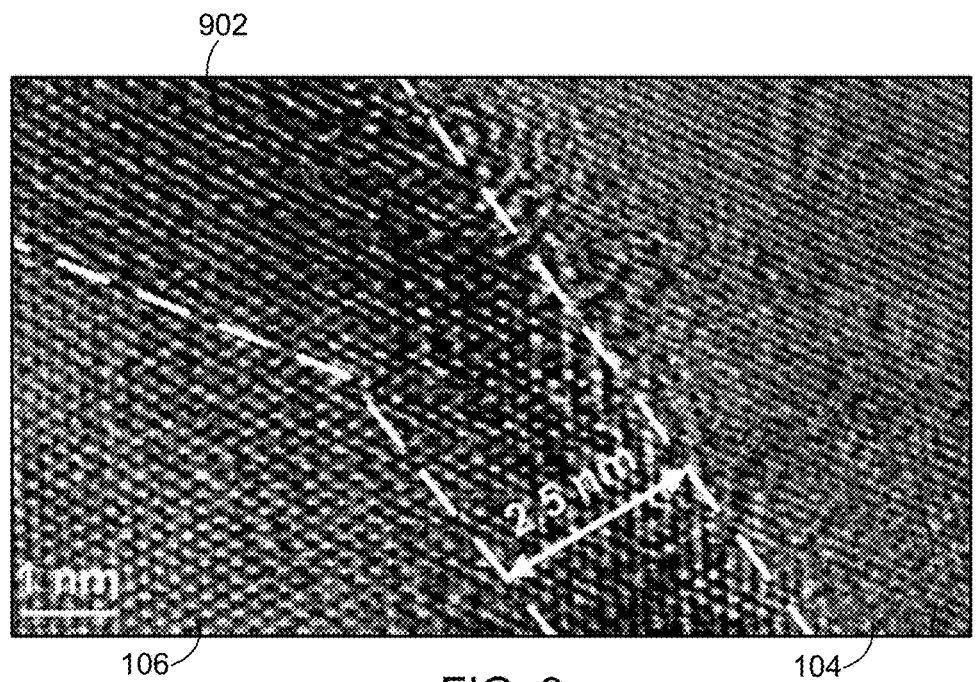
FIG. 9 is an HRTEM image showing the atom arrangement at a heterojunction of graphene 104 and $MoS_2$ 106 with a 2.5-nm overlapping region 902.

Since there is a large lattice mismatch (25%) between graphene and $MoS_2$, the epitaxial growth between graphene and $MoS_2$ is, in principle, more difficult than that between graphene and hBN or between two different TMDs. High-resolution transmission electron microscopy (HRTEM) was, therefore, carried out on the graphene-$MoS_2$ parallel-stitched heterostructures 104/106 for structural characterization (as seen in FIGS. 8 and 9). Selected-area TEM diffractograms indicate that the dark area 902 between the dashed lines in FIG. 9 consists of graphene and $MoS_2$, while only $MoS_2$ 106 (left side) or graphene 104 (right side) can be observed outside the interface region. This indicates that $MoS_2$ 106 overlaps with graphene 104 at the boundary between them. The width of most of the overlapping region 902 is typically 2-30 nm. FIG. 9 shows a heterojunction with an overlap region 902 that is only 2.5 nm wide. The atomic structures can clearly be seen on the $MoS_2$, graphene, and overlapping regions 902; and diffractograms through fast Fourier transform (FFT) in each of these three regions revealed a diffraction pattern from the $MoS_2$ lattice structure with a spacing of 2.7 Å, corresponding to the (100) planes and 2.1 Å spacing from (110) planes of graphene lattice structure. The FFT diffraction pattern of the overlapping region 902 indicates that there is a 5° rotation angle between the $MoS_2$ 106 and graphene 104 lattices, while the corresponding $MoS_2$ 106 and graphene 104 lattice spacings individually remain at 2.7 Å and 2.1 Å, respectively, in the overlapping region 902, indicating that there is no lattice distortion at their interface. Similar analysis was done on additional samples, which shows that the rotation angles between the two materials 104 and 106 are all within a small range of 0-10°.

A closer look revealed more atomic defects in the overlapping region 902 than were found in the regions away from the interface. The main two kinds of defects found in the $MoS_2$ lattice are Mo—Mo bond defects and —S— bridge defects. The —S— bridge defect looks like an eight-member ring in the lattice, while the Mo—Mo bond defect corresponds to a 4+8-member ring. Both defects have been observed at $MoS_2$ grain boundaries. In the overlapping regions 902 of the lateral structures, however, the $MoS_2$ defects are mainly eight-member ring defects, indicating that the absence of seed molecules 108 on graphene 104 is related to a lack of sulfur for growth of $MoS_2$ 106. Possibly, the increased density of defects at the interface results in the inhibition of $MoS_2$ growth further into the graphene region 104.

Figure 10:
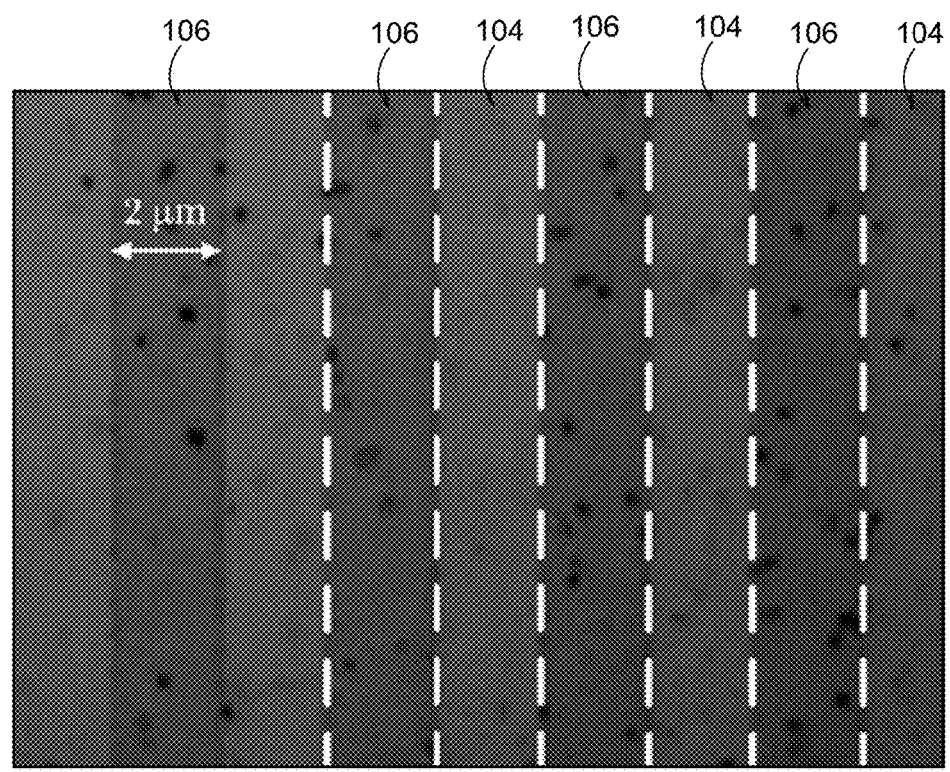
FIG. 10 is an optical image of a periodic array of graphene 104 and $MoS_2$ 106 produced by parallel stitching of graphene 104 and $MoS_2$ 106.
Figure 11:
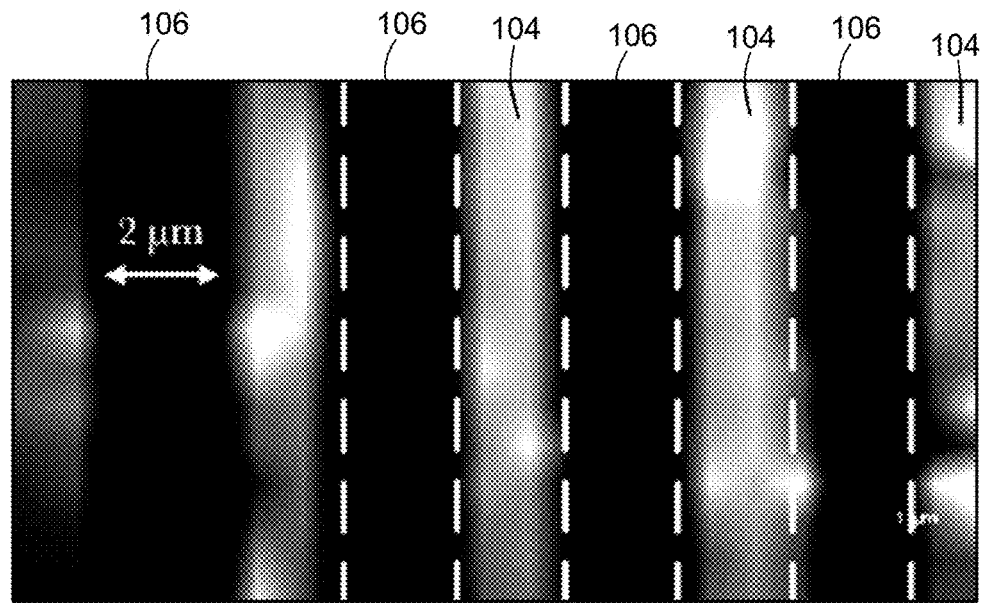
FIG. 11 is the corresponding mapping image of G-band intensity of graphene 104 in the array of FIG. 10.
Figure 12:
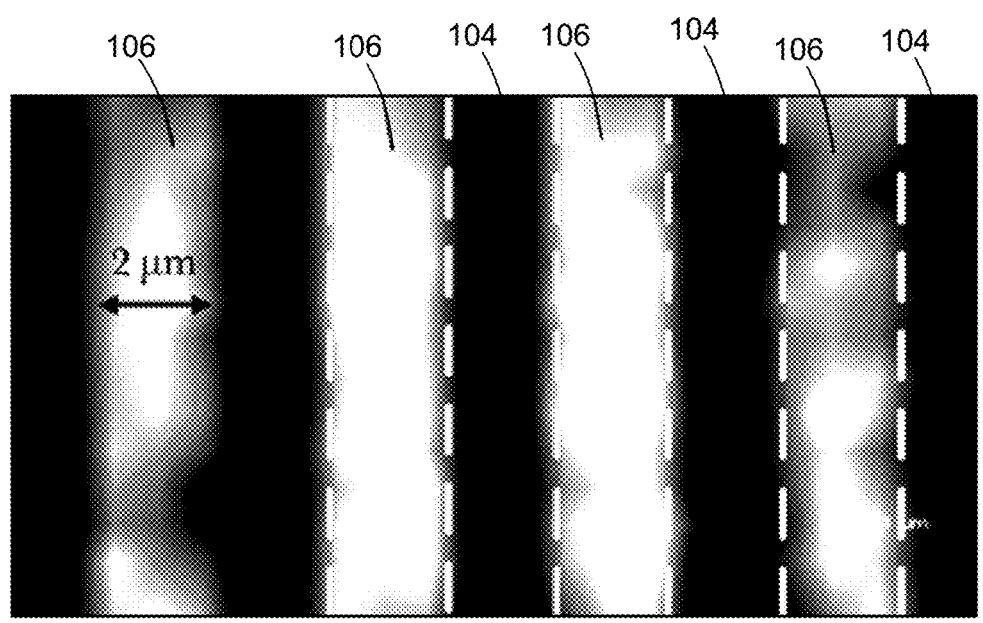
FIG. 12 is the corresponding mapping image of PL intensity of $MoS_2$ 106 in the array of FIG. 10.
Figure 13:
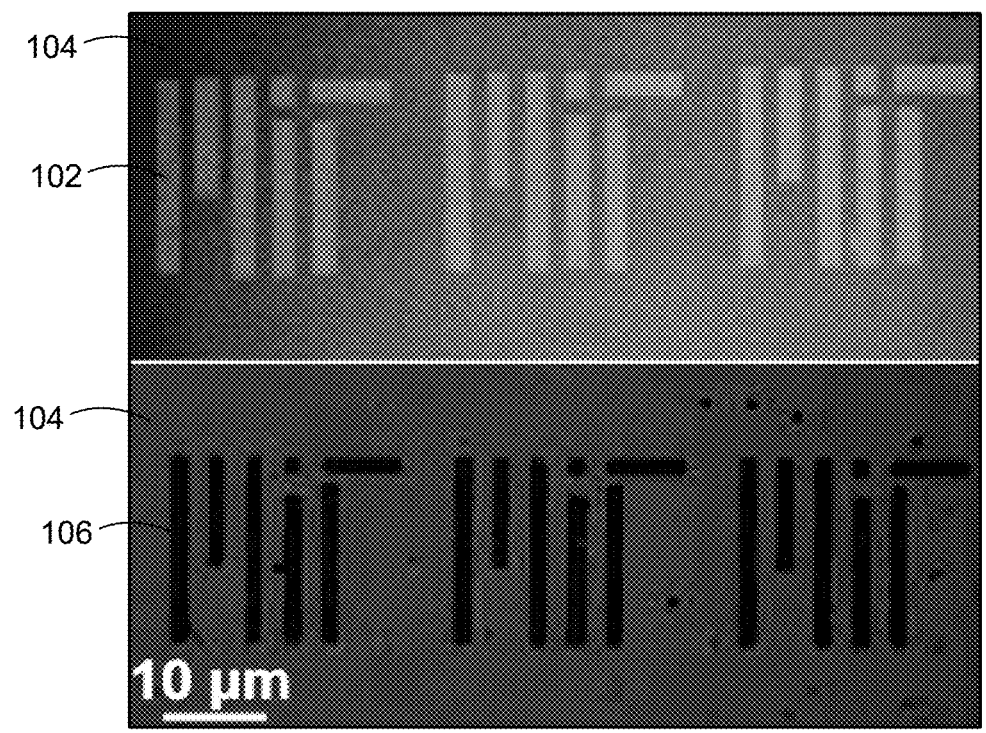
FIG. 13 includes optical images before (top) and after (bottom) $MoS_2$ 106 is grown on a graphene 104 stencil pattern with the "MIT" logo.
Figure 14:
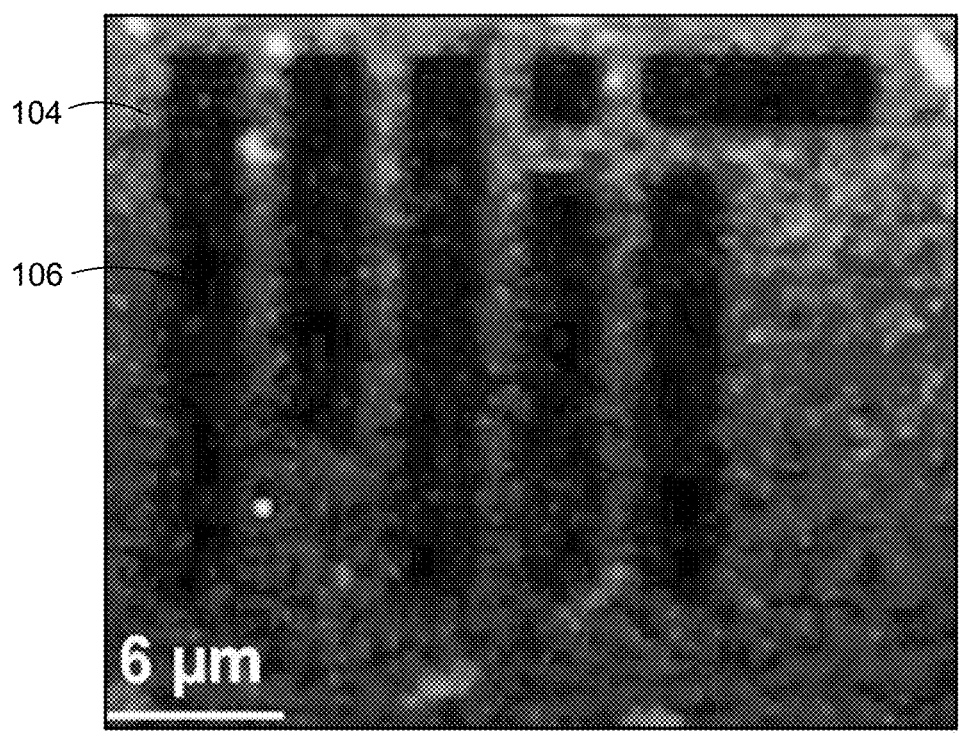
FIG. 14 is a mapping image of the G-band intensity of graphene 104 in the logo of FIG. 13.
Figure 15:
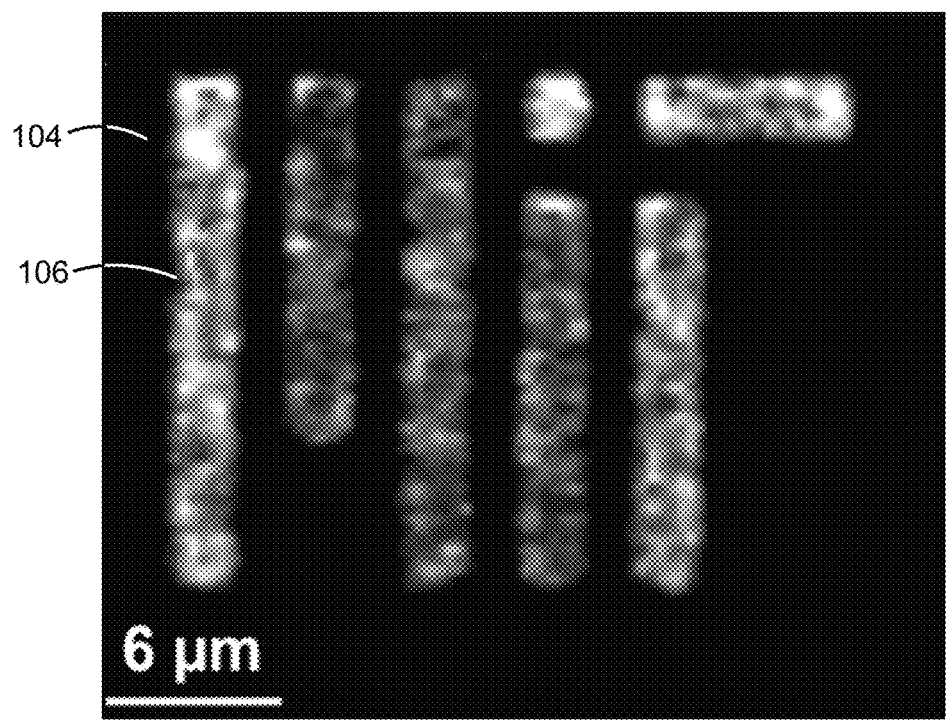
FIG. 15 is a mapping images of the PL intensity of $MoS_2$ 106 in the logo of FIG. 13.
Figure 16:
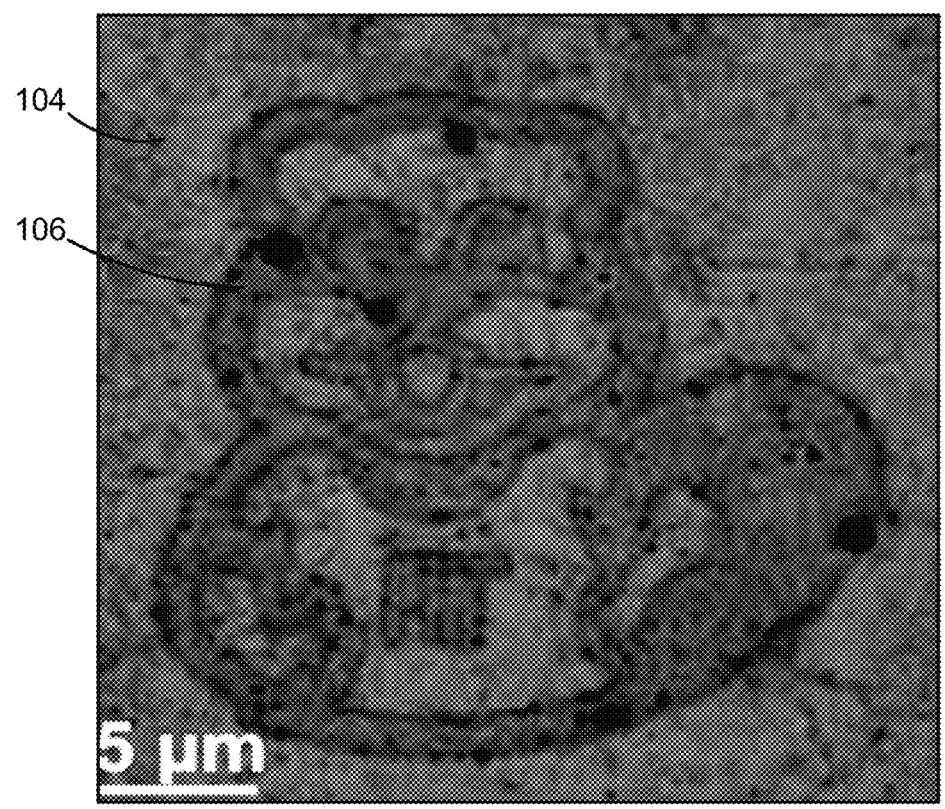
FIG. 16 is an optical image of a $MoS_2$-106-filled MIT mascot, "Tim the beaver", in a graphene 104 pattern.
Figure 17:
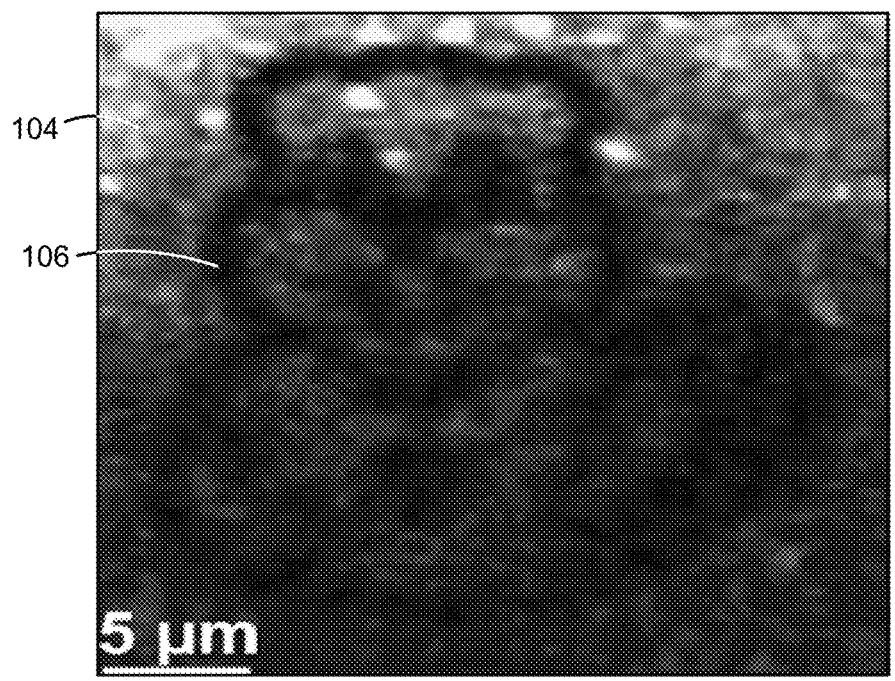
FIG. 17 is the corresponding mapping image of G-band intensity of graphene 104 in the pattern of FIG. 16.
Figure 18:
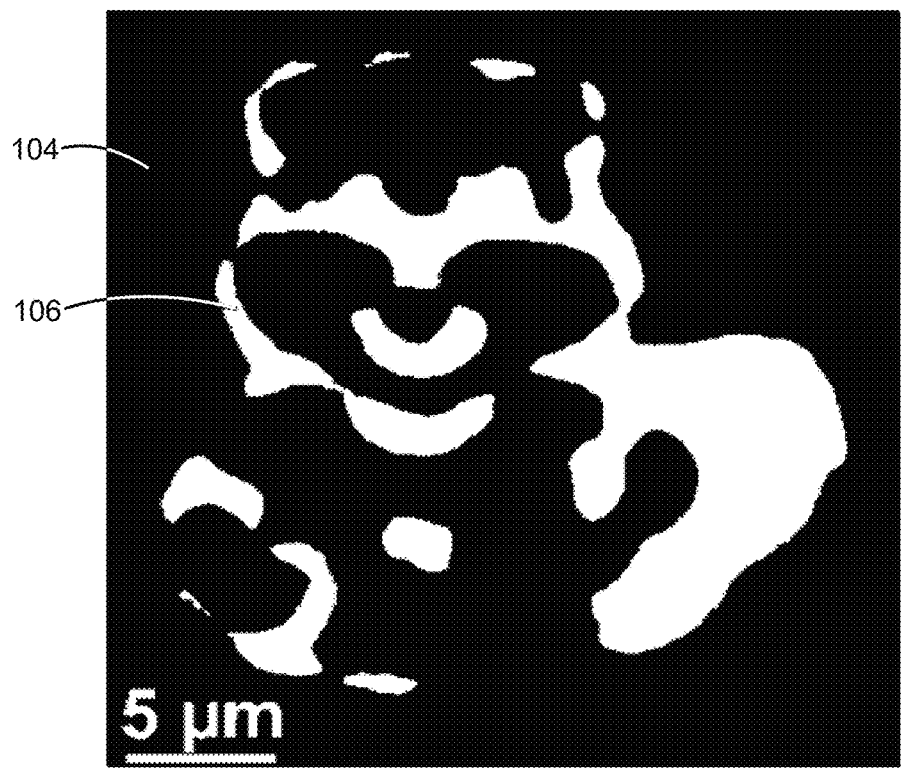
FIG. 18 is the corresponding mapping image of PL intensity of $MoS_2$ 106 in the pattern defined by the graphene 104 of FIG. 16.

One unique advantage of the parallel-stitching method is that it enables large-scale integration. Demonstrated herein is the construction of many graphene-Mo $S_2$ parallel-stitched heterostructures 112 with arbitrary patterns (as seen in FIGS. 10-18). These Figures show the typical optical images and spectroscopy characterization of a parallel-stitched graphene-$MoS_2$ heterostructure array (FIGS. 10-12), the Massachusetts Institute of Technology (MIT) logo (FIGS. 13-15), and the MIT mascot, "Tim the Beaver" (FIGS. 16-18). One can observe that the mapping images of the G-band Raman intensity from graphene (FIGS. 11, 14, and 17) and PL intensity from $MoS_2$ (FIGS. 12, 15 and 18) are highly correlated with each other and match well with the corresponding optical image (FIGS. 10, 13, and 16). The AFM image in the inset in FIG. 10 indicates that the periodic heterostructures 104 and 106 are well connected with very narrow overlaps at the interfaces. These morphological and spectroscopic measurement results give further evidence that the $MoS_2$ 106 and graphene 104 are separated in space and stitched together at the edges. Using this method, one can design graphene-$MoS_2$ heterojunctions at will. As shown by the $MoS_2$-filled "MIT" logo (as seen in FIGS. 13-15) and $MoS_2$-filled MIT mascot, "Tim the Beaver" (as seen in FIGS. 16-18), the spatial resolution of the $MoS_2$ patterns 106 in the images can be as low as 1 μm (limited by the spatial resolution of the spectrometer). The geometrical flexibility, high controllability and large-scale fabrication capability offers great opportunity for 2D hybrid multifunctional applications.

Figure 19:
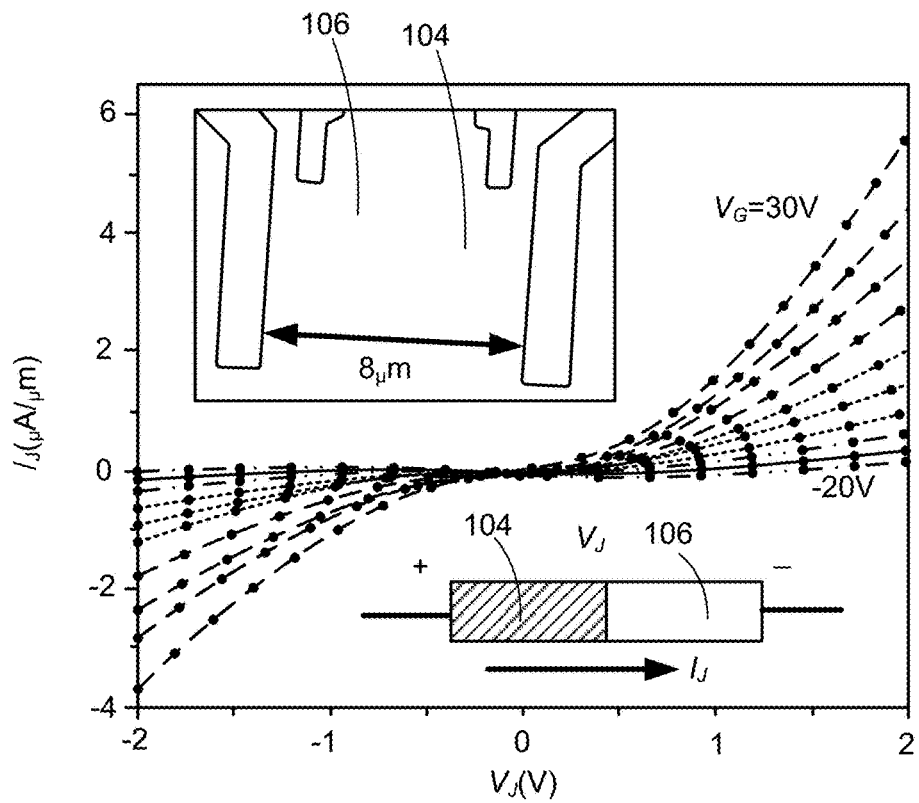
FIG. 19 plots the transport measurement results of a large-scale integrated circuit application of a parallel-stitched heterojunction of graphene 104 and $MoS_2$ 106. The output characteristics of the graphene-$MoS_2$ heterojunction are plotted with different gate biases from −20V to 30V with 5V intervals. The upper inset is a microscopic image of the four-probe graphene-$MoS_2$ heterojunction device on top of 300 nm of $SiO_2$ as the back gate dielectric. The lower inset is a schematic of the device with graphene 104 as the positive side and $MoS_2$ 106 as the negative side of the junction.
Figure 20:
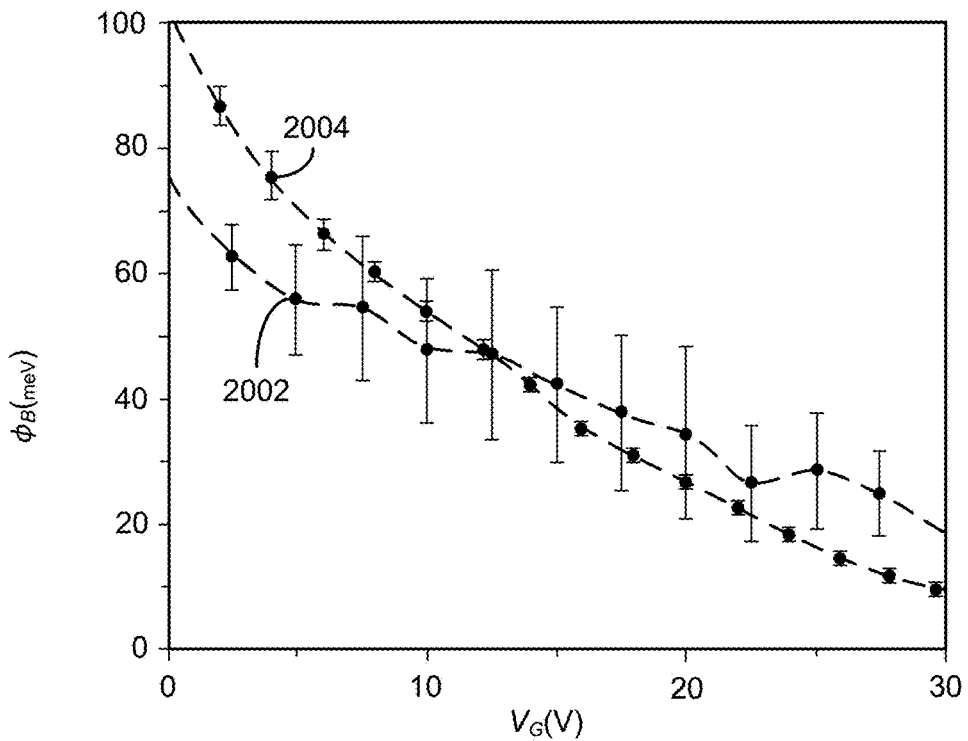
FIG. 20 is a plot of the barrier height at the lateral 2002 and vertical 2004 graphene-$MoS_2$ heterojunctions as a function of the gate voltage of the heterojunction of FIG. 19.
Figure 21:
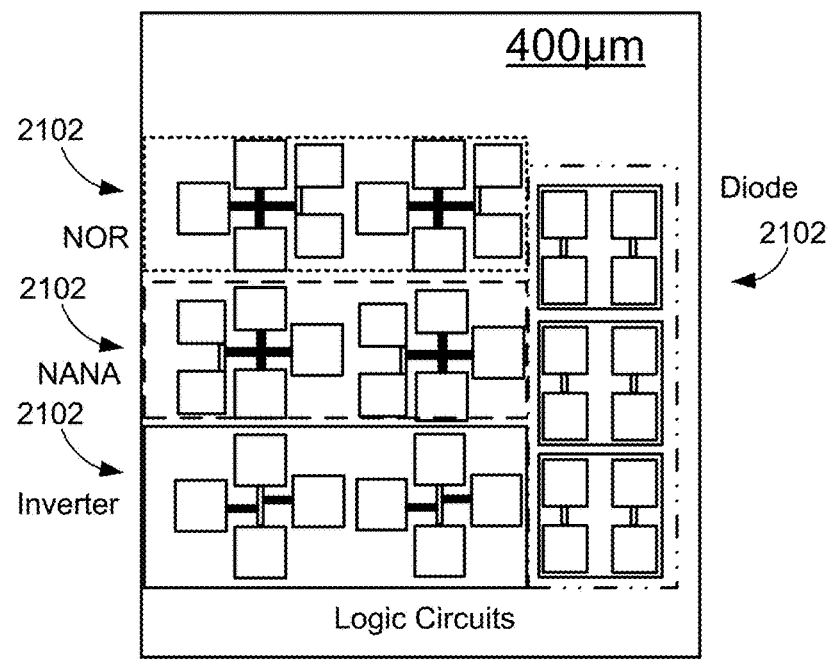
FIG. 21 is a microscopic image of a test chip of logic circuit arrays 2102 based on the parallel-stitched graphene-$MoS_2$ heterojunctions.

Transport measurements across graphene-$MoS_2$ parallel-stitched heterojunctions indicate that a weak tunneling barrier forms at the junction. The inset in FIG. 19 shows an optical image of the device, while the plot shows both the reverse-bias current (when $V_j<0$) and the forward-bias current (when $V_j>0$) increase superlinearly with the junction voltage. This behavior is an indication that a tunneling barrier is present. FIG. 20 shows the measured barrier height ($\Phi_B$) for lateral 2002 and vertical 2004 graphene-$MoS_2$ heterojunctions (from temperature-dependent measurements) as a function of gate voltage, the barrier height is extracted to be around 70 meV at zero gate voltage and less than 20 meV at high positive gate voltage ($V_G>30$ V), which is similar to that for the graphene-$MoS_2$ vertically stacked heterostructure 112. The junction resistance ($R_j=V_j/I_j$) is around 0.3 kΩ·mm when $MoS_2$ is turned on ($V_G=30V$). Recent works have shown that graphene-$MoS_2$ vertically stacked heterostructures, when used as contacts to $MoS_2$ channels, can lead to a much lower contact resistance than conventional metal contacts. The vertically stacked structures, however, would suffer from various problems when the $MoS_2$ transistors are scaled down to nanometer scale, such as (i) difficulty in alignment with a high spatial resolution, (ii) the lack of a selective etching technique, and (iii) the large parasitic impedances. In contrast, the parallel-stitched junctions grown with the method presented herein can serve as a self-aligned lateral Ohmic contact to the $MoS_2$ channel. Such contact has been referred to as 1D contact, and has been shown to be able to address these problems very well without degrading contact quality. Implementing these 1D contacts has previously been a tremendously challenging task but can be simply realized with our selective "sowing" method here.

Figure 22:
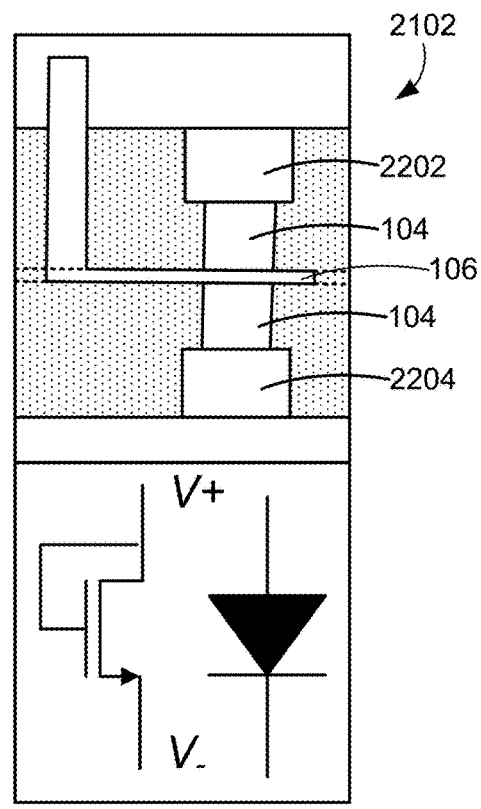
FIG. 22 is a microscopic image and transistor-level schematic of a diode-connected transistor, including graphene 104, $MoS_2$ 106, a positive-voltage terminal 2202, and a negative-voltage terminal 2204, where the length of the white scale bar is 10 μm.
Figure 23:
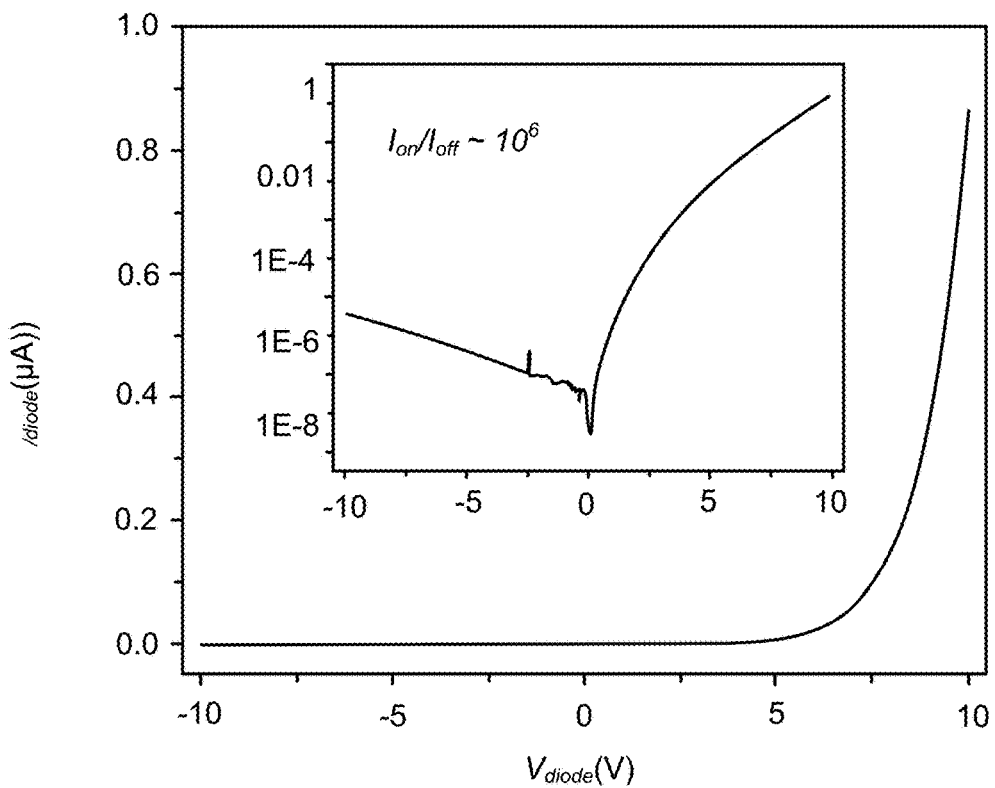
FIG. 23 is a plot of the I-V characteristic of the diode-connected transistor of FIG. 22, where the inset plots the I-V characteristic of the diode in a log scale. The on-off ratio is around $10^6$.
Figure 24:
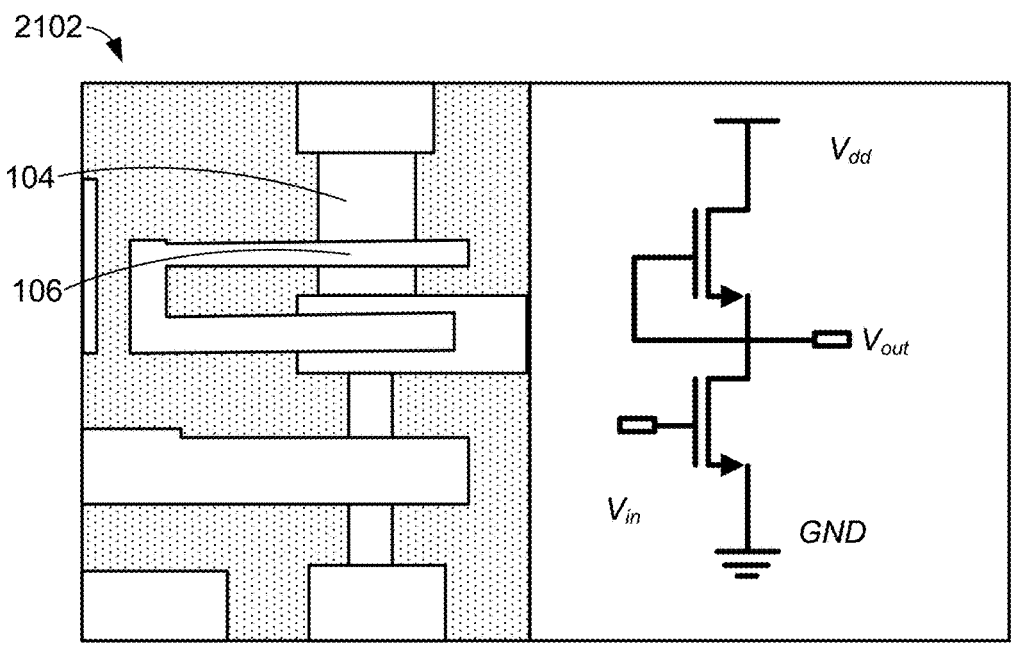
FIG. 24 is a microscopic image and transistor-level schematic of an inverter, where the white scale bar is 10 μm.
Figure 25:
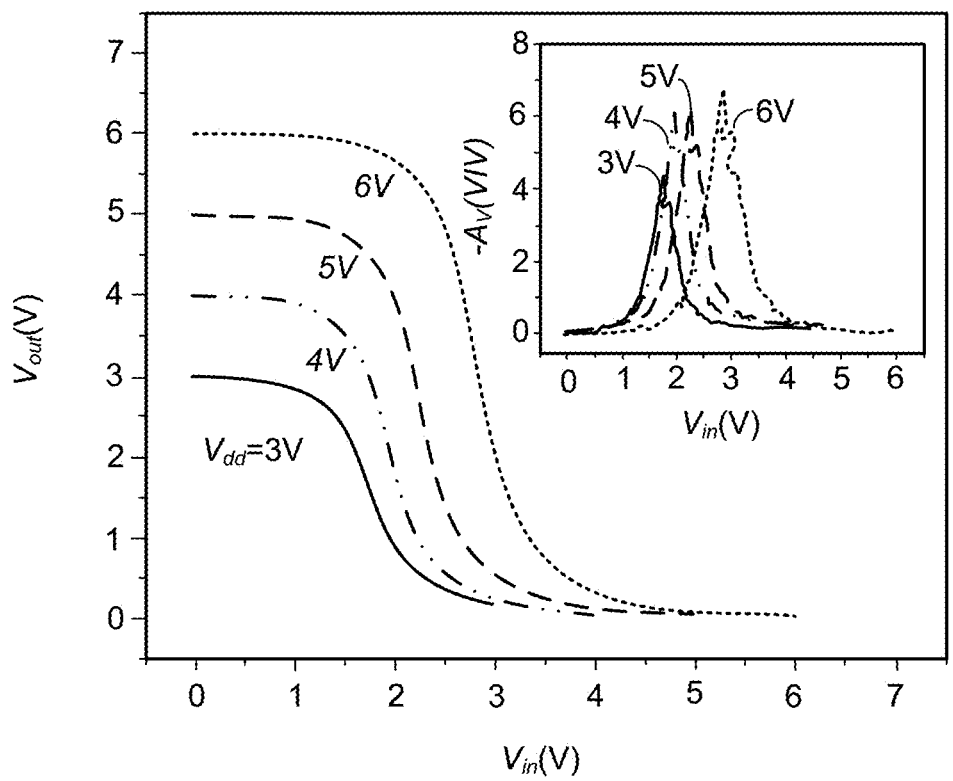
FIG. 25 is a plot of the voltage transfer characteristic of the inverter of FIG. 24, with the power supply voltage ($V_{dd}$) from 3V to 6V. The inset is a plot of the corresponding voltage gain ($A_v = dV_{out}/dV_{in}$) of the inverter.
Figure 26:
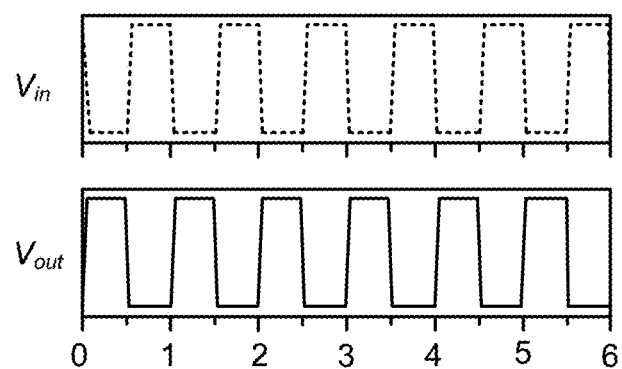
FIG. 26 plots the transient response of the inverter of FIG. 24.
Figure 27:
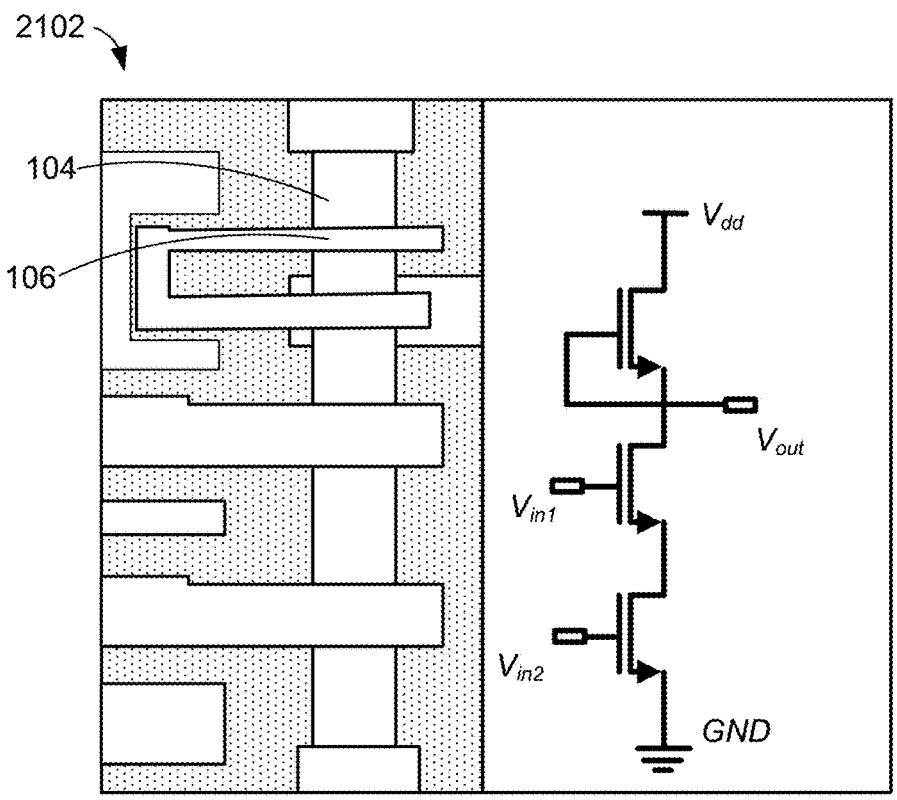
FIG. 27 is a microscopic image and transistor-level schematic of a NAND gate, where the image at left is a microscopic image and transistor-level schematic of an inverter, where the length of the white scale bar is 10 μm.
Figure 28:
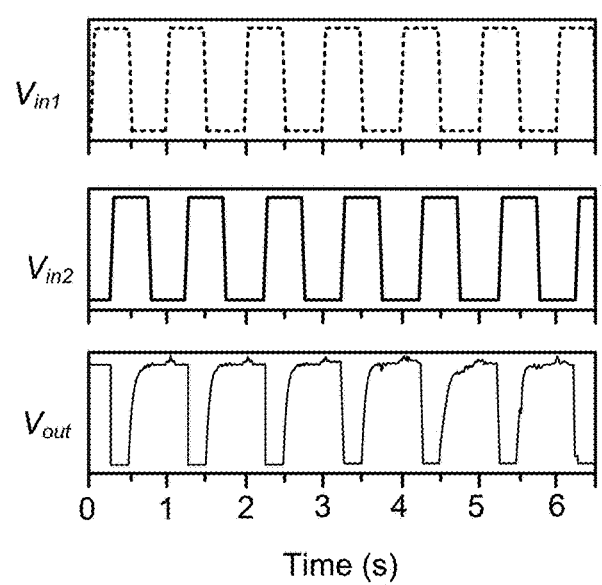
FIG. 28 plots the transient response of the NAND gate of FIG. 27.

Using graphene-$MoS_2$ parallel-stitched heterostructures 112 as the source/drain contacts of top-gated $MoS_2$ transistors, we fabricated arrays of the basic building blocks of integrated circuits 2102 (shown in FIGS. 21-28). FIG. 22 shows the microscopic image and the transistor-level schematic of a diode-connected $MoS_2$ transistor, indicating good rectifying behavior (with an on-off current ratio on the order of 106) obtained according to the I-V characteristics in FIG. 23. Based on the direct-coupled transistor logic (DCTL) technology, as described in Wang, H., et al., "Integrated circuits based on bilayer $MoS_2$ transistors." 12 Nano Lett. 4674-4680 (2012), which has been widely used in high-speed logic circuits with low power consumption, we successfully fabricated inverter (FIGS. 24-26) and NAND gates (FIGS. 27 and 28), which are a complete set of logic circuits and can, in principle, realize any two-level combinational logics. FIG. 24 plots the typical voltage transfer characteristics of an inverter, with the power supply voltage ($V_{dd}$) ranging from 3V to 6V, with a full logic swing and a symmetric and abrupt on-off transition. The voltage gain, given by $A_v=dV_{out}/dV_{in}$, as shown in the inset of FIG. 24 has a sharp peak at the medium voltage level ($V_{dd}/2$), with a value up to 7. This, together with the well-matched input-output range, guarantees the normal operation when multiple stages of logic gates are cascaded. FIGS. 26 and 28 show the transient responses of an inverter and a NAND gate, respectively, in which the output voltage of the inverter is always the opposite of the input voltage, and the output voltage of the NAND gate is "low" only when both its inputs are "high".

Figure 29:
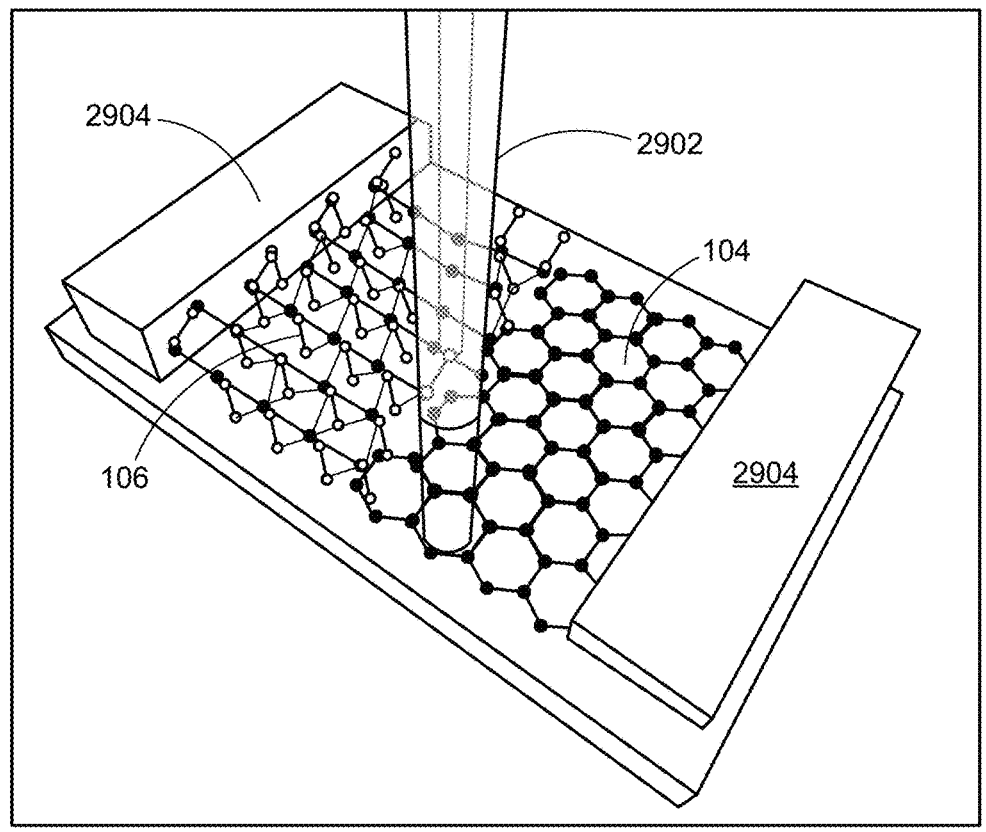
FIG. 29 is a schematic illustration of a laser 2902 directed onto a parallel-stitched heterojunction of graphene 104 and $MoS_2$ 2902 bounded by gold terminals 2904 to generate a photoresponse.
Figure 30:
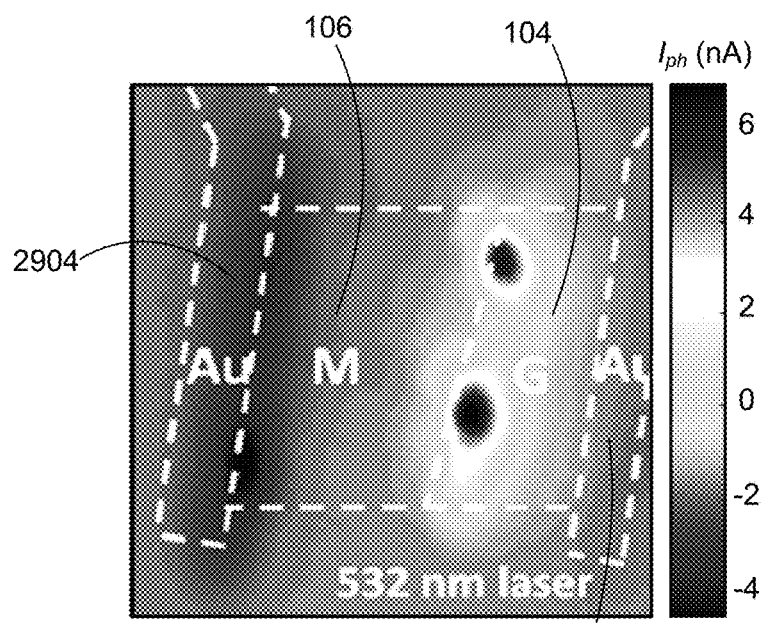
FIG. 30 is a scanning photocurrent microscopy image of a device, as shown in FIG. 29, with an incident laser wavelength of 532 nm and a power of 118 μW. The measurement was performed at room temperature (300 K). The white dashed lines represent the profile of the device obtained from the reflectance image.
Figure 31:
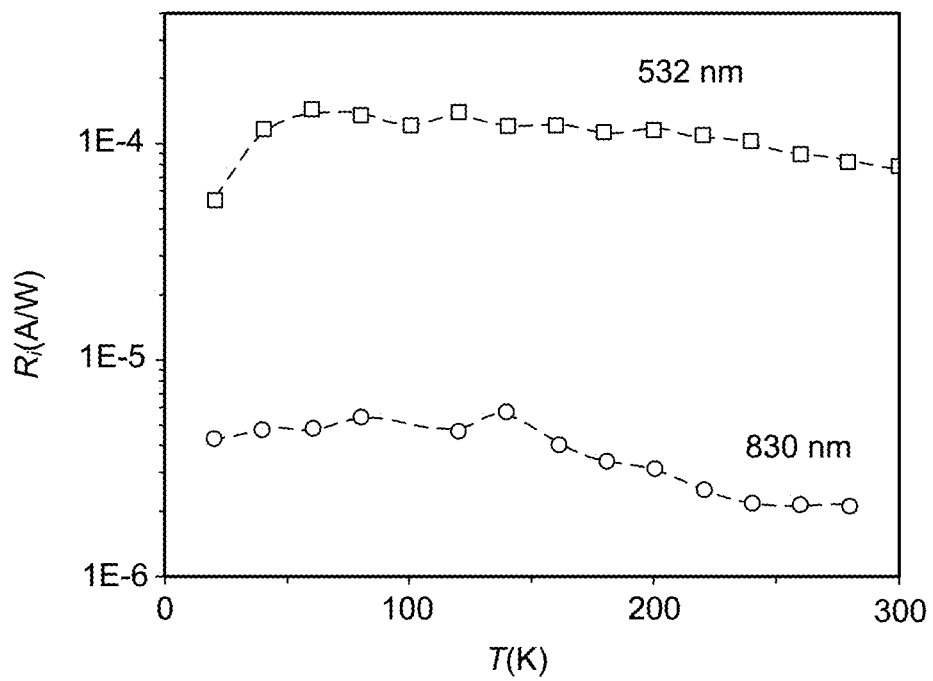
FIG. 31 plots the current photoresponsivity [$R_i = I_{ph}/W_{laser}$, wherein $I_{ph}$ is the photocurrent (or short-circuit current), and wherein $W_{laser}$ is the incident laser power] as a function of the temperature. The square and circular dots are measured with the excitation laser wavelength of 532 nm and 830 nm, respectively.

In spite of the weak barrier at the parallel-stitched graphene-$MoS_2$ heterojuction, prominent photocurrent response can still be observed, with the excitation photon energy both above (2.33 eV or 532 nm) and below (1.49 eV or 830 nm) the bandgap of $MoS_2$ (1.85 eV). From the scanning photocurrent spectroscopy measurements, as shown in FIG. 30, with zero junction voltage bias ($V_j=0$), relatively large photoresponses (triggered by the laser light 2902 near the interface of graphene 104 and $MoS_2$ 106 and at the interface of $MoS_2$ 106 and Au 2904 (as shown in FIG. 29) were observed with both laser excitation wavelengths, but the photoresponse at the graphene-$MoS_2$ junction was measured to be at least one order of magnitude larger than that at the $MoS_2$—Au junction. The spatial asymmetry of the photocurrent profile along the junction and the weak temperature dependence (as seen in FIG. 31) indicate that the photoresponse of these devices is dominated by the photo-thermoelectric (PTE) effect. Due to the large Seeback coefficient difference between graphene 104 and $MoS_2$ 106, when light 2902 is being absorbed at the graphene 104 side, the resulting temperature rise leads to the large photoresponse.

Figure 32:
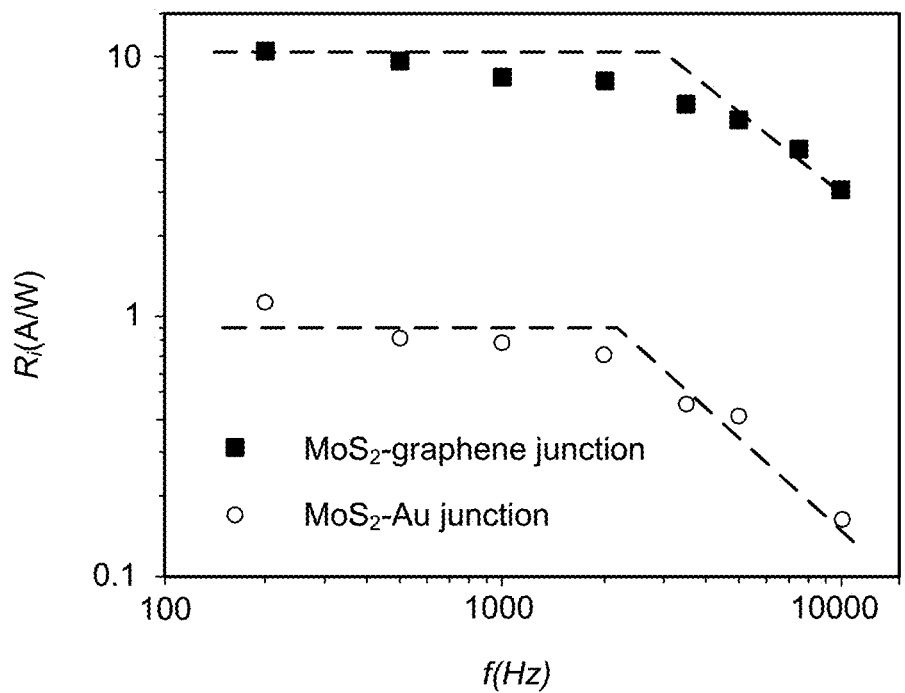
FIG. 32 is a plot of voltage photoresponsivity=$V_{ph}/W_{laser}$, wherein $V_{ph}$ is the photovoltage, or open-circuit voltage) with the laser beam shining at the graphene-$MoS_2$ interface (squares) and at the $MoS_2$—Au interface (circles) as a function of the chopper frequency that modulates the amplitude of the excitation laser. From the frequency dependence, we are able to extract the time constant of the photodetector (the elbow of the dotted curves) to be around 33 μs.

Such PTE photodetectors are promising candidates for broadband photodetection at or near room temperature. In the near- to mid-infrared range, the PTE photodetectors, unlike the conventional photovoltaic or photoconductive detectors, do not specify any spectrum limit; and they convert the incident photon energies into heat, which can be accumulated for a known time interval and thus can operate at room temperature. Additionally, the Seebeck coefficients of monolayer $MoS_2$ and graphene are around 104 and 102 μV/K, respectively. With such a large difference in Seebeck coefficients and given that graphene has broadband light absorption, $MoS_2$ and graphene can provide an excellent combination for use in PTE photodetectors. Furthermore, the ultra-thin lateral structure of the devices makes it easier to generate large temperature gradients compared with vertical heterostructures, and the device responds faster to the changing light field due to its much smaller heat capacity than do bulk materials. Using a mechanical chopper modulated laser source, the response time of the device is extracted to be around 33 μs (FIG. 32), which is faster than $MoS_2$ photodetectors. Our findings suggest that the graphene-$MoS_2$ parallel-stitched heterojunctions may be useful in room-temperature broadband photoimaging applications.

In summary, as conventional lithography/selective etching is incapable for use in the large scale integration of 2D materials to achieve various M-S, S—S, S—I, M-I junctions for future electronics and optoelectronics, in this work a universal methodology is proposed to address such challenges. By introducing the selective "sowing" of the molecules as seeds at different positions on a growth substrate 102 during the synthesis of monolayer TMD materials, heterojunctions of TMD with other 2D materials can be constructed, either vertically or horizontally. The method of heterojunction formation is effective, simple and powerful, not only offering solutions for large-scale 2D material integration, but also enabling versatile parallel-stitched in-plane junctions which are unique in structure and properties, thus offering tremendous potential, as demonstrated through the example of large-scale manufacturing of parallel-stitched graphene-$MoS_2$ heterostructures 112 and the investigation of their potential applications.

Figure 33:
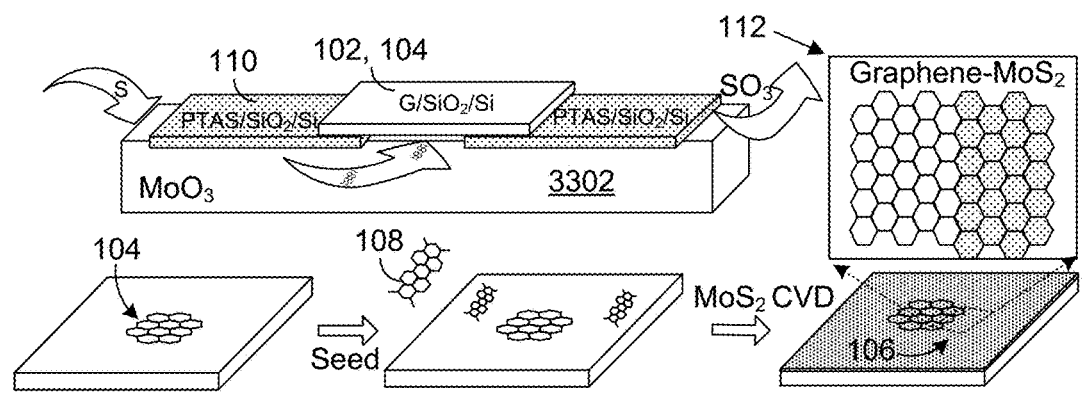
FIG. 33 is a schematic illustration of a CVD process for the synthesis of the parallel-stitched graphene-$MoS_2$ heterostructure 112.

Methods
Heterostructure Growth:

In this work, graphene was prepared by either mechanical exfoliation or CVD growth and transferred onto a cleaned 300-nm-thick $SiO_2$/Si substrate. Other 2D materials ($WS_2$ and hBN) were prepared by mechanical exfoliation. For the parallel-stitched heterostructures 112 between $MoS_2$ and other 2D materials, PTAS molecules were used as seeds 108. A 300-nm-thick $SiO_2$/Si substrate (serving at the growth substrate 102) coated with the first 2D material 104 (pre-annealed at 380° C. for 2 hours with 200 sccm Ar/200 sccm $H_2$ gas flow as protection) was suspended between two $SiO_2$/Si substrates with abundant PTAS 108 as the seed reservoir 110, as shown in FIG. 33. All of these substrates were faced down and placed in a crucible containing molybdenum oxide ($MoO_3$) precursor 3302. This crucible was put in the middle of a 1-inch quartz tube reaction chamber, with another sulfur (S) containing crucible upstream in the quartz tube. Before heating, the whole CVD system was purged with 1000 sccm Ar (99.999% purity) for three minutes. Next, 5 sccm Ar was introduced into the system as a carrier gas. The system was heated to 650° C. at a rate of 15° C./min, and $MoS_2$ was synthesized at 650° C. for three minutes under atmospheric pressure. The temperature at the position where the sulfur was located was set to be around 180° C. during growth. The system was finally cooled down to room temperature quickly by opening the furnace and taking out the quartz tube, and 1000 sccm Ar flow was used to remove the reactants. The vertically stacked heterostructures 112 were achieved using a similar process but by vacuum thermal evaporation of $F_{16}CuPc$ molecules on the substrate 102 as seeds 108.

TEM Characterization:

An as-grown graphene-$MoS_2$ heterostructure 112 was transferred onto a transmission-electron-microscope (TEM) grid (Quantifoil, No. 656-200-CU from TED PELLA, INC., of Redding, Calif., USA) using a poly(methyl methacrylate) (PMMA) transfer layer, as described in U.S. Pat. No. 8,535,553 B2 and in US App. Pub. No. 2014/0245946 A1. After transfer onto a TEM grid, the PMMA was removed under vacuum annealing at 350° C. for half an hour. High-resolution-transmission-electron-microscopy (HRTEM) characterization of the heterostructure 112 at the atomic scale was carried out with a JOEL ARM 200CF TEM (from JEOL USA, Peabody, Mass., USA) equipped with a cold field-emission electron source and two spherical-aberration correctors operated under an accelerating voltage of 80 kV to reduce radiation damage.

AFM and Spectroscopy Characterization:

The AFM characterization was carried out on a DIMENSION 3100 instrument, commercially available from Veeco Instruments Inc. of Plainview, N.Y., USA. PL and Raman spectra were carried out on a HR800 system from Horiba Jobin-Yvon of Edison, N.J. USA, and Kyoto, Japan, and an Alpha300-Confocal Raman Microscope from WITec Instruments of Ulm, Germany. The laser excitation wavelength for the PL and Raman measurements was typically 532.5 nm. The laser power on the sample was about 0.1 mW. A 100× objective was used to focus the laser beam. The spectral parameters were obtained by fitting the peaks using Lorentzian/Gaussian mixed functions, as appropriate. For Raman and PL mapping, the scan step is 0.8 μm on the Horiba Jobin-Yvon HR800 system and 0.3 μm on the WITec Alpha300-Confocal Raman Microscope.

Device Fabrication and Measurement:

The $MoS_2$-graphene heterostructures were first transferred onto the 300-nm-thick $SiO_2$/Si substrates through the PMMA transfer technique, as mentioned earlier. E-beam lithography (EBL) and e-beam evaporation followed by a lift-off process were used to deposit Au to a thickness of 20 nm as the Ohmic contacts. Another EBL and reactive ion etching (ME) with oxygen plasma were used to define the channel area. For top-gated devices, a thickness of 35 nm of $Al_2O_3$ was deposited through atomic layer deposition (ALD) as the gate dielectric, followed by an e-beam evaporation of 30 nm of Pd as the gate electrodes.

The transport measurements were carried out in vacuum (~$10^{-5}$ Torr) using a semiconductor parameter analyzer (Agilent 4155C analyzer from Agilent Technologies of Santa Clara, Calif., USA) and a cryogenic probe station (from Lake Shore Cryotronics, Inc., of Westerville, Ohio). The spatial photoresponse of the devices was measured with a confocal laser scanning microscopy setup. The chips were wire-bonded onto a chip carrier and mounted in a ST-500 helium optical cryostat (from Janis Research Company of Woburn, Mass., USA) equipped with electrical connections, a well-defined microscopic optical path and a temperature-controlling system.

Supplemental Exemplification of the Materials Growth:

In this work, graphene was prepared by both mechanical exfoliation and chemical vapor deposition (CVD) growth and transferred onto a cleaned 300-nm-thick $SiO_2$/Si substrate. Other two-dimensional (2D) materials ($WS_2$ and hBN) were prepared by mechanical exfoliation. CVD graphene was synthesized on copper foil (99.9%, 127 μm thick, Alfa Aesar) using low-pressure chemical vapor deposition inside a one-inch quartz tube. Before the growth, the copper foil was annealed under 10-sccm hydrogen ($H_2$) (~400 mTor) for 30 min. During the growth, one-sccm methane ($CH_4$) and 50-sccm $H_2$ were introduced for one hour (~1.5 mTor). After that, the copper foil was cooled down to room temperature under the same atmosphere. For the graphene transfer process, poly(methyl methacrylate) (PMMA, 4.5% in anisole) was spun coated onto the graphene/copper foil at 2500 rpm. The copper foil was etched using a copper etchant (CE-100 etchant from Transene Company, Inc., of Danvers, Mass., USA). After etching, the film with graphene and PMMA was transferred to another water bath to remove the residual etchant. After replacing the water three times, the graphene was transferred onto a 300-nm-thick $SiO_2$/Si substrate; and the PMMA was removed by acetone vapor.

A schematic illustration of the CVD setup and the process for the synthesis of the parallel-stitched graphene-$MoS_2$ heterostructure 112 is provided in FIG. 33. To synthesize the parallel-stitched heterostructure 112 between $MoS_2$ and other 2D materials, based on the seeding promoter-assisted CVD (SPA-CVD) growth of monolayer $MoS_2$, perylene-3,4,9,10-tetracarboxylic acid tetrapotassium salt (PTAS) molecules were chosen as seeds. PTAS was prepared by mixing 3,4,9,10-perylene tetracarboxylic dianhydride (PTCDA) and ethanol and KOH and refluxing for 20 hours. PTAS was filtrated out by adding ethyl ether as an extracting agent. PTAS powder was obtained after evaporating water. 0.1 mol/L PTAS/water solution was prepared for use. Taking graphene-$MoS_2$ as an example, a 300-nm-thick $SiO_2$/Si substrate with either exfoliated or patterned CVD graphene, which was used as a growth substrate 102, was suspended between two $SiO_2$/Si substrates with coated PTAS as the seed reservoir 110, as shown in FIG. 33.

It should be mentioned that, before loading the growth substrate 102 into the furnace, annealing was done at 380° C. for two hours to the growth substrate 102 to remove the residue with the protection of 200 sccm Ar and 200 sccm $H_2$, which reduced the possible influence of the residues and impurities to the nucleation of the MoS$_2$. All of these substrates were faced down and placed in a crucible containing molybdenum oxide (MoO$_3$) precursor. This crucible was put in the middle of a one-inch quartz tube reaction chamber, with another sulfur(S)-containing crucible upstream in the quartz tube. Before heating, the whole CVD system was purged with 1000 sccm Ar (99.999% purity) for 3 min. Then, 5 sccm Ar was introduced into the system as a carrier gas. The system was heated to 650° C. at a rate of 15° C./min, and MoS$_2$ was synthesized at 650° C. for 3 min under atmospheric pressure. The temperature, at the position where sulfur located, was around 180° C. during growth. It should be mentioned that the average diffusion rate of S at 180° C. is about 17 m/s according to the Maxwell diffusion equation, which is much larger than the 5 sccm gas flow. Therefore, the transfer of S to the substrate surrounding region was mainly by diffusion. The function of the carrier gas Ar was for diluting and controlling the concentration of S. The system was finally cooled down to room temperature quickly by opening the furnace and taking out the quartz tube, and 1000 sccm Ar flow was used to remove the reactants.

Figure 34:
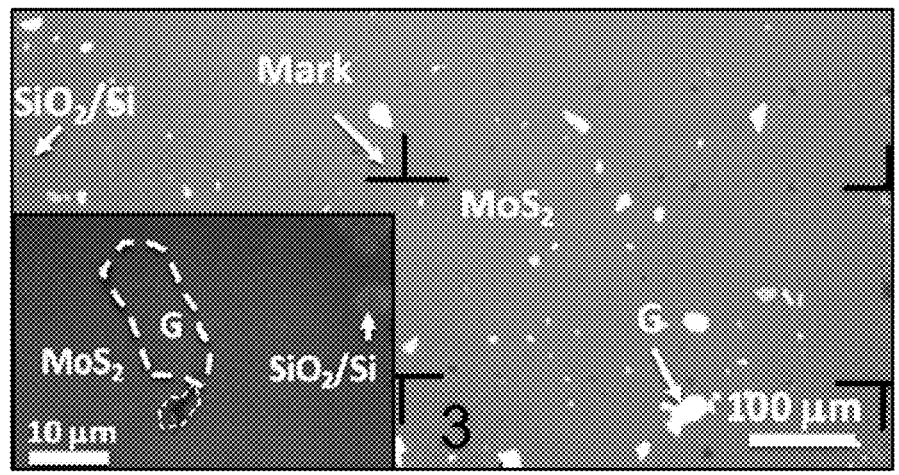
FIG. 34 is a microscopic image of a typical growth result of a parallel-stitched heterostructure of graphene-$MoS_2$. The insert shows the corresponding high-magnification optical images with the 2D graphene (G) flakes surrounded by the monolayer $MoS_2$ that was grown.
Figure 35:
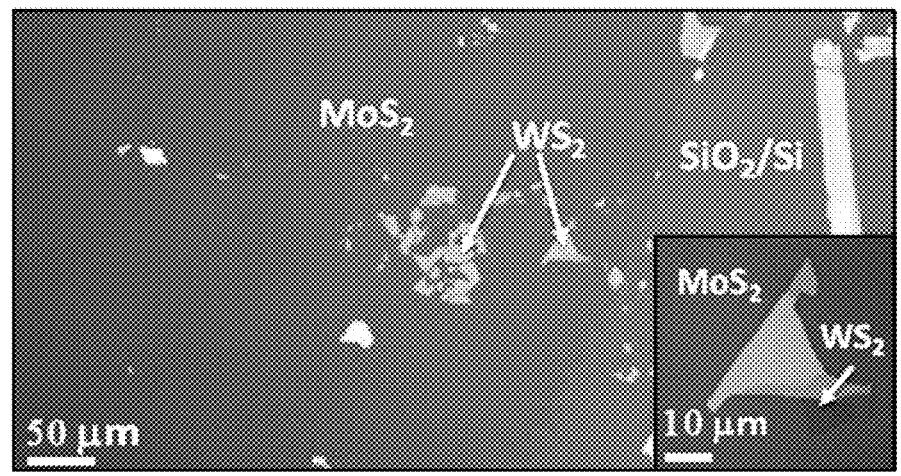
FIG. 35 is a microscopic image of a typical growth result of a parallel-stitched heterostructure of $WS_2$—$MoS_2$. The insert shows the corresponding high-magnification optical images with the 2D $WS_2$ flakes surrounded by the monolayer $MoS_2$ that was grown.
Figure 36:
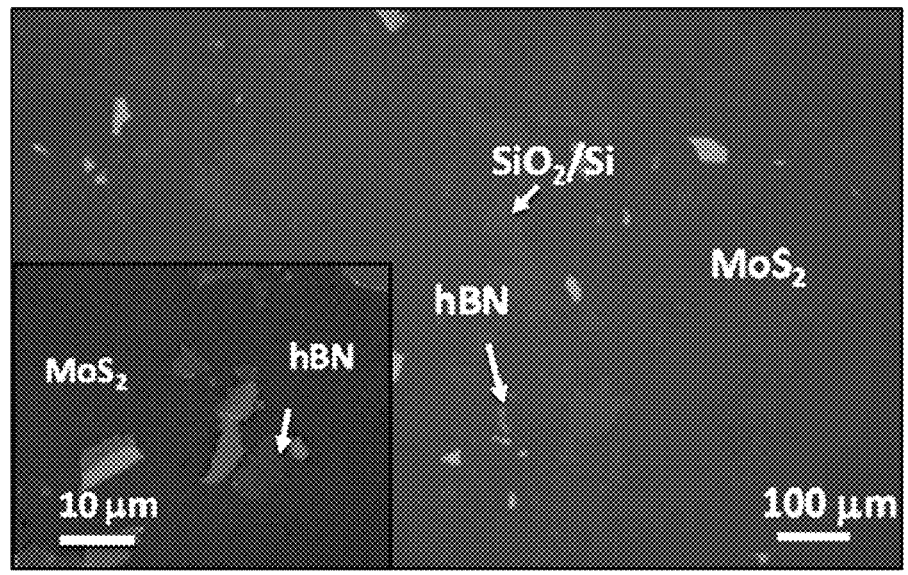
FIG. 36 is a microscopic image of a typical growth result of a parallel-stitched heterostructure of hBN-$MoS_2$. The insert shows the corresponding high-magnification optical images with the 2D hBN flakes surrounded by the monolayer $MoS_2$ that was grown.

This setup allowed the PTAS seeds 108 to be transferred from the seed reservoirs 110 to the growth substrate 102 under the growth temperature (650° C.). PTAS, however, was observed to more likely be deposited onto a hydrophilic surface (SiO$_2$) rather than onto the surfaces of 2D materials, which are highly hydrophobic, PTAS molecules 108 are "sowed" only in the regions without graphene 104. Since the growth of MoS$_2$ 106 relies on the existence of the aromatic molecular seeds 108 in SPA-CVD, MoS$_2$ 106 only grew on the area without graphene 104. The parallel-stitched graphene-MoS$_2$ heterostructure 112 was, therefore, formed with the MoS$_2$ connected to the edge of graphene (G), as shown in FIG. 34, which shows a typical optical image of the growth results of the graphene-MoS$_2$ heterostructure, where the monolayer MoS$_2$ film covers most of the substrate, and where the flakes on the substrate are exfoliated graphene sheets with different thicknesses. The insert in FIG. 34 shows a zoom-in optical image with a MoS$_2$ monolayer grown surrounding a piece of monolayer graphene (marked by the white dashed line). Similarly, lateral heterostructures between MoS$_2$ and various 2D materials can be obtained. FIGS. 35 and 36 show typical results for parallel-stitched WS$_2$—MoS$_2$ and hBN-MoS$_2$ heterostructures, respectively.

The freedom of choice of different aromatic molecular seeds 108, which enhances the nucleation process in growth, offers an opportunity to construct different types of heterostructures 112 between MoS$_2$ 106 and other 2D materials, because the variety of the wettability of seeds 108 makes it possible to constrain the growth of 2D materials within a designed geometry if we locally change the wettability of the growth substrate 102 accordingly. To synthesize the vertically stacked heterostructures 112, copper(II) 1,2,3,4,8,9,10,11,15,16,17,18,22,23,24,25-hexadecafluoro-29H,31H-phthalocyanine (F16CuPc) molecules were deposited on the growth substrate 102 (on which other 2D material was transferred beforehand) as seeds 108 by standard vacuum thermal evaporation. Then, the regular process was carried out to synthesize monolayer MoS$_2$ 106. Since F$_{16}$CuPc 108 could remain on graphene 104 or hBN 104 under the growth conditions, the vertically stacked heterostructure 112 between MoS$_2$ and graphene or hBN was obtained.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step. Likewise, a single element or step may be replaced with a plurality of elements or steps that serve the same purpose. Further, where parameters for various properties or other values are specified herein for embodiments of the invention, those parameters or values can be adjusted up or down by $1/100^{th}$, $1/50^{th}$, $1/20^{th}$, $1/10^{th}$, $1/5^{th}$, $1/3^{rd}$, $1/2$, $2/3^{rd}$, $3/4^{th}$, $4/5^{th}$, $9/10^{th}$, $19/20^{th}$, $49/50^{th}$, $99/100^{th}$, etc. (or up by a factor of 1, 2, 3, 4, 5, 6, 8, 10, 20, 50, 100, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions, and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references may or may not be included in embodiments of this invention. Still further, the components and steps identified in the Background section are integral to this disclosure and can be used in conjunction with or substituted for components and steps described elsewhere in the disclosure within the scope of the invention. In method claims (or where methods are elsewhere recited), where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A method for synthesizing a two-dimensional heterostructure, comprising:
   producing a patterned first two-dimensional material on a growth substrate, wherein the patterned first two-dimensional material defines at least one void through which an exposed region of the growth substrate is exposed;
   selectively depositing seed molecules either on the exposed region of the growth substrate or on the patterned first two-dimensional material; and
   growing a second two-dimensional material from the seed molecules, wherein the second two-dimensional material is distinct from the patterned first two-dimensional material.

2. The method of claim 1, wherein the growth substrate has a hydrophilic surface.

3. The method of claim 2, wherein the patterned first two-dimensional material is hydrophobic.

4. The method of claim 3, wherein the patterned first two-dimensional material and the second two-dimensional material have respective crystalline structures with a substantial lattice mismatch.

5. The method of claim 3, wherein the seed molecules are perylene-3,4,9,10-tetracarboxylic acid tetrapotassium salt molecules.

6. The method of claim 3, wherein the patterned first two-dimensional material is selected from a metal, a semiconductor and an insulator.

7. The method of claim 3, wherein the patterned first two-dimensional material is selected from graphene, hexagonal boron nitride, and a transition metal dichalcogenide.

8. The method of claim 7, wherein the second two-dimensional material comprises a transition metal dichalcogenide.

9. The method of claim 3, wherein the seed molecules selectively deposit on the exposed region of the growth substrate.

10. The method of claim 9, wherein the second two-dimensional material is grown side-by-side with the patterned first two-dimensional material.

11. The method of claim 10, wherein the patterned first two-dimensional material and the second two-dimensional material overlap by no more than 50 nm.

12. The method of claim 1, wherein the seed molecules are selectively grown on the patterned first two-dimensional material.

13. The method of claim 12, wherein the seed molecules are copper(II) 1,2,3,4,8,9,10,11,15,16,17,18,22,23,24,25-hexadecafluoro-29H,31H-phthalocyamine molecules.

14. The method of claim 12, wherein the second two-dimensional material is grown on the patterned first two-dimensional material.

15. The method of claim 1, wherein the growth substrate comprises silica.

16. The method of claim 1, wherein the patterned first two-dimensional material and the second two-dimensional material have a thickness no greater than 10 atomic layers.

17. The method of claim 1, further comprising depositing the first two-dimensional material on the growth substrate and then patterning the first two-dimensional material on the growth substrate.

18. A device with a two-dimensional heterostructure, comprising:
    a growth substrate;
    a pattern of a first two-dimensional material on the growth substrate, wherein patterned two-dimensional material defines at least one void; and
    a second two-dimensional material on the growth substrate in the void defined by the patterned first two-dimensional material, wherein the first two-dimensional material and the second two-dimensional material have a thickness no greater than 10 atomic layers, and wherein the second two-dimensional material fills the void but does not overlap with the first two-dimensional material by more than 50 nm.

19. The device of claim 18, wherein the growth substrate has a hydrophilic surface.

20. The device of claim 18, wherein the first two-dimensional material is hydrophobic.

21. The device of claim 20, wherein the first two-dimensional material and the second two-dimensional material have respective crystalline structures with a substantial lattice mismatch.

22. The device of claim 18, further comprising aromatic seed molecules at an interface between the growth substrate and the second two-dimensional material.

23. The device of claim 22, wherein the aromatic seed molecules comprise perylene-3,4,9,10-tetracarboxylic acid tetrapotassium salt molecules.

24. The device of claim 18, wherein the first two-dimensional material and the second two-dimensional material are components of a logic integrated circuit.

25. The device of claim 18, wherein the first two-dimensional material and the second two-dimensional material are components of a broadband photodetector.

* * * * *